(12) United States Patent
Na et al.

(10) Patent No.: US 12,524,096 B2
(45) Date of Patent: Jan. 13, 2026

(54) INPUT SENSING UNIT AND DISPLAY APPARATUS INCLUDING THE SAME

(71) Applicant: SAMSUNG DISPLAY CO., LTD., Yongin-si (KR)

(72) Inventors: Jisu Na, Yongin-si (KR); Kwang-min Kim, Seoul (KR); Kiwook Kim, Hwaseong-si (KR); Yangwan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/006,917

(22) Filed: Dec. 31, 2024

(65) Prior Publication Data

US 2025/0138661 A1 May 1, 2025

Related U.S. Application Data

(63) Continuation of application No. 18/423,269, filed on Jan. 25, 2024, now Pat. No. 12,182,350, which is a
(Continued)

(30) Foreign Application Priority Data

Sep. 12, 2018 (KR) .................. 10-2018-0109296
Oct. 26, 2018 (KR) .................. 10-2018-0129175

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/047* (2013.01); *H10K 59/131* (2023.02); *H10K 59/40* (2023.02)

(58) Field of Classification Search
CPC ........ G06F 3/0412; G06F 3/041; G06F 3/044; G06F 3/047; G06F 2203/04107; H10K 59/131; H10K 59/40
See application file for complete search history.

(56) References Cited

U.S. PATENT DOCUMENTS 9,164,636 B2 * 10/2015 Kuo ..................... G06F 3/0443
9,281,347 B2    3/2016 Choi et al.
(Continued)

FOREIGN PATENT DOCUMENTS

CN         108153445         6/2018
KR    10-2013-0003215        1/2013
(Continued)

OTHER PUBLICATIONS

Non-Final Office Action dated May 10, 2023, issued to U.S. Appl. No. 18/097,448.
(Continued)

*Primary Examiner* — Sardis F Azongha
(74) *Attorney, Agent, or Firm* — Womble Bond Dickinson (US) LLP

(57) ABSTRACT

An input sensing unit including a plurality of first electrodes, which are arranged in a first direction and each of which extends in a second direction crossing the first direction, a plurality of row electrode each of which includes a second electrode and a third electrode, a plurality of first sensing lines respectively connected to the first electrodes, a plurality of second sensing lines respectively connected to the second electrodes, and a third sensing line connected to each of the third electrodes. Each of the row electrodes includes one side and the other side, which are opposed to each other in the first direction, and the one side is connected to one of one second sensing line and one third sensing line of the
(Continued)

second sensing lines, and the other side is connected to the other of the second sensing lien and the third sensing line.

15 Claims, 21 Drawing Sheets

Related U.S. Application Data continuation of application No. 18/097,448, filed on Jan. 16, 2023, now Pat. No. 11,899,869, which is a continuation of application No. 17/532,944, filed on Nov. 22, 2021, now Pat. No. 11,556,198, which is a continuation of application No. 17/146,021, filed on Jan. 11, 2021, now Pat. No. 11,182,007, which is a continuation of application No. 16/565,276, filed on Sep. 9, 2019, now Pat. No. 10,890,998.

(51) Int. Cl.
*G06F 3/047* (2006.01)
*H10K 59/131* (2023.01)
*H10K 59/40* (2023.01)

(56) References Cited

U.S. PATENT DOCUMENTS

| | | | |
|---|---|---|---|
| 9,735,389 | B2 | 8/2017 | Lee |
| 10,013,088 | B2 | 7/2018 | Kim et al. |
| 10,062,739 | B2 | 8/2018 | Jang et al. |
| 10,656,742 | B2 | 5/2020 | Kim et al. |
| 10,720,474 | B2 | 7/2020 | Hwang et al. |
| 11,243,647 | B2 | 2/2022 | Seo et al. |
| 2010/0045614 | A1 | 2/2010 | Gray et al. |
| 2014/0168138 | A1 | 6/2014 | Kuo et al. |
| 2014/0253499 | A1 | 9/2014 | Lee et al. |
| 2017/0287992 | A1 | 10/2017 | Kwak et al. |
| 2018/0011598 | A1 | 1/2018 | Ku et al. |
| 2018/0059869 | A1 | 3/2018 | Ma |
| 2018/0150176 | A1 | 5/2018 | Kim et al. |
| 2018/0321793 | A1 | 11/2018 | Kim et al. |
| 2018/0329555 | A1 | 11/2018 | Kim |
| 2018/0329576 | A1 | 11/2018 | Kim et al. |
| 2019/0265827 | A1 | 8/2019 | Liu et al. |
| 2019/0312097 | A1 | 10/2019 | Choi et al. |

FOREIGN PATENT DOCUMENTS

| | | |
|---|---|---|
| KR | 10-2015-0048999 A | 5/2015 |
| KR | 10-2016-0072372 A | 6/2016 |
| KR | 10-2016-0074375 | 6/2016 |
| KR | 10-2016-0110676 A | 9/2016 |
| KR | 10-2018-0006519 | 1/2018 |
| KR | 10-2018-0062540 | 6/2018 |
| KR | 10-2018-0075784 A | 7/2018 |
| KR | 10-1886801 | 8/2018 |
| KR | 10-2019-0117866 | 10/2019 |
| TW | 2018028004 | 12/2016 |

OTHER PUBLICATIONS

Final Office Action dated Aug. 3, 2023, issued to U.S. Appl. No. 18/097,448.

Notice of Allowance dated Oct. 4, 2023, issued to U.S. Appl. No. 18/097,448.

* cited by examiner

INPUT SENSING UNIT AND DISPLAY APPARATUS INCLUDING THE SAME

CROSS-REFERENCE TO RELATED APPLICATIONS

This application is a continuation of U.S. patent application Ser. No. 18/423,269, filed Jan. 25, 2024, now U.S. Pat. No. 12,182,350, which is a continuation of U.S. patent application Ser. No. 18/097,448, filed Jan. 16, 2023, now U.S. Pat. No. 11,899,869, which is a continuation of U.S. patent application Ser. No. 17/532,944, filed Nov. 22, 2021, now U.S. Pat. No. 11,556,198, which is a continuation of U.S. patent application Ser. No. 17/146,021, filed Jan. 11, 2021, now U.S. Pat. No. 11,182,007, which is a continuation of U.S. patent application Ser. No. 16/565,276, filed Sep. 9, 2019, now U.S. Pat. No. 10,890,998, which claims priority to and the benefit of Korean Patent Application No. 10-2018-0109296, filed Sep. 12, 2018, and Korean Patent Application No. 10-2018-0129175, filed Oct. 26, 2018, the entire content of all of which is incorporated herein by reference.

BACKGROUND

Field

Exemplary embodiments generally relate to an input sensing unit and a display apparatus including the same, and, more particularly, to an input sensing unit having improved electrical reliability and a display apparatus including the same.

Discussion

Various electronics used in multimedia devices, such as televisions, mobile phones, table computers, navigation devices, game consoles, and the like, are being developed. Such electronics may include a keyboard or a mouse as an input unit. In addition, the electronics may include a display apparatus. Such a display apparatus typically includes a display unit as an output device and an input sensing unit as an input device.

The above information disclosed in this section is only for understanding the background of the inventive concepts, and, therefore, may contain information that does not form prior art.

SUMMARY

An exemplary embodiment provide an input sensing unit capable of improving external input sensitivity.

An exemplary embodiment provide a display apparatus including an input sensing unit capable of improving external input sensitivity.

Additional aspects will be set forth in the detailed description which follows, and, in part, will be apparent from the disclosure, or may be learned by practice of the inventive concepts.

According to an exemplary embodiment, an input sensing unit includes first electrodes, row electrodes, first sensing lines, second sensing lines, and a third sensing line. The first electrodes are arranged in a first direction. Each of the first electrodes extend in a second direction crossing the first direction. The row electrodes are arranged in the second direction. The row electrodes include second electrodes and third electrodes. The second electrodes extend in the first direction. The third electrodes are configured to receive an electrical signal different from the second electrodes. The first sensing lines are respectively connected to the first electrodes. The second sensing lines are respectively connected to the second electrodes. The third sensing line is connected to the third electrodes. Each of the row electrodes includes a first side and a second side opposing the first side in the first direction. The first side is connected to one of a second sensing line among the second sensing lines and the third sensing line. The second side is connected to the other of the second sensing line among the second sensing lines and the third sensing line.

According to an exemplary embodiment, a display apparatus includes: a display unit and an input sensing unit. The display unit is configured to display an image. The input sensing unit is disposed on a surface of the display unit. The input sensing unit includes first electrodes, second electrodes, third electrodes, first sensing lines, second sensing lines, and a third sensing line. The first electrodes are arranged in a first direction. Each of the first electrodes extends in a second direction crossing the first direction. The second electrodes are arranged in the second direction. Each of the second electrodes extends in the first direction. The third electrodes are arranged in the second direction. Each of the third electrodes extends in the first direction. The first sensing lines are respectively connected to the first electrodes. The second sensing lines are respectively connected to the second electrodes. The third sensing line is connected to the third electrodes. The third sensing line is connected to a first side of a portion of the third electrodes and connected to a second side of each of a remaining portion of the third electrodes. The second side opposes the first side in the first direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF THE ILLUSTRATED EMBODIMENTS

Figure 1:
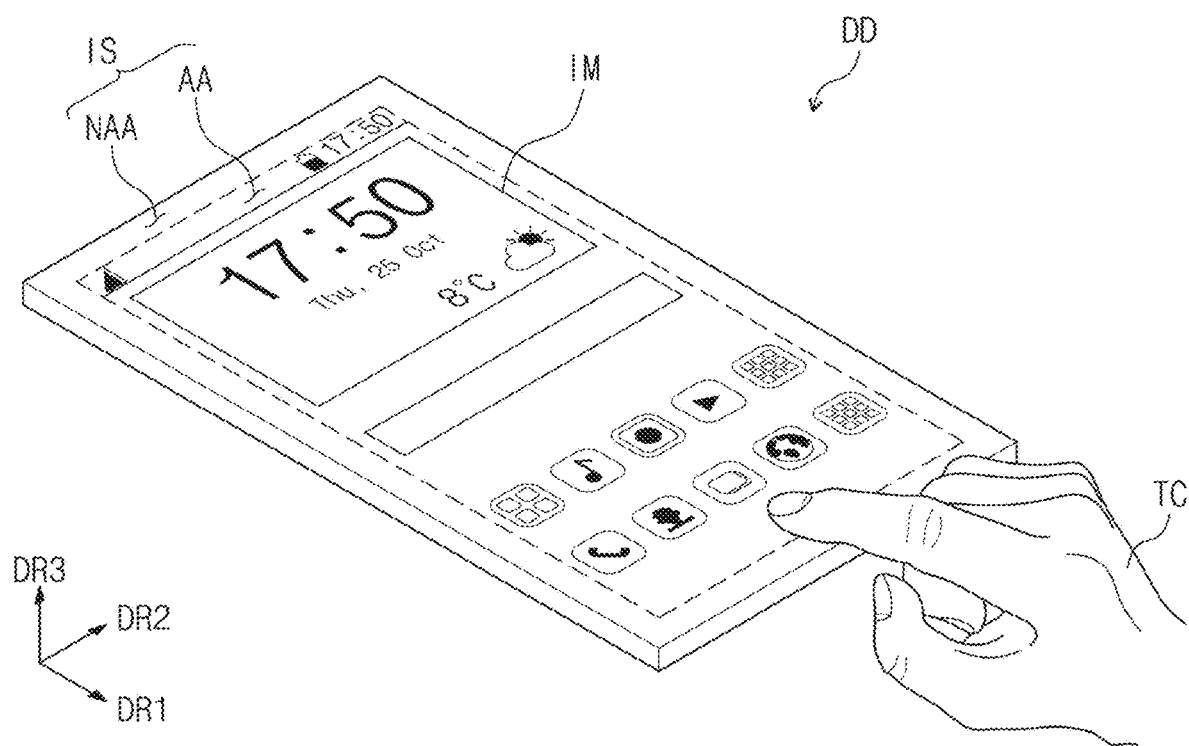
FIG. 1 is a perspective view of a display apparatus according to an exemplary embodiment.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of an exemplary embodiment. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, an exemplary embodiment are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of an exemplary embodiment may be physically separated into two or more interacting and discrete blocks, units, and/or modules without departing from the inventive concepts. Further, the blocks, units, and/or modules of an exemplary embodiment may be physically combined into more complex blocks, units, and/or modules without departing from the inventive concepts.

Hereinafter, various exemplary embodiments will be explained in detail with reference to the accompanying drawings.

FIG. 1 is a perspective view of a display apparatus according to an exemplary embodiment. Referring to FIG. 1, a display apparatus DD may display an image IM through a front surface IS. The front surface IS is parallel to a surface defined by a first directional axis DR1 and a second directional axis DR2.

A normal direction of the front surface IS, i.e., a thickness direction of the display apparatus DD, is indicated as a third directional axis DR3. A front surface (or a top surface) and a rear surface (or a bottom surface) of each of members, units, layers, etc., which will be described below, are distinguished by the third directional axis DR3. However, the first to third directional axes illustrated in this embodiment may be merely examples. Hereinafter, first to third directions may be directions indicated by the first to third directional axes DR1, DR2, and DR3, and designated by the same reference numerals, respectively.

Although the display apparatus DD having a planar front surface is illustrated as an exemplary embodiment, exemplary embodiments are not limited thereto. The display apparatus DD may include a curved front surface or a solid front surface. The solid front surface may include a plurality of display areas that indicate different directions. For example, the solid front surface may include a polygonal column-type front surface.

The display apparatus DD as seen in FIG. 1 may be a rigid display apparatus. However, exemplary embodiments are not limited thereto. For example, the display apparatus DD may be a flexible display apparatus DD. According to an exemplary embodiment, the display apparatus DD is capable of being applied to a mobile terminal.

Although not shown in FIG. 1, electronic modules, a camera module, a power module, and the like, which are mounted on (or coupled to) a main board, may be disposed on (or in) a bracket/case together with the display apparatus DD to constitute the mobile terminal. The display apparatus DD according to an exemplary embodiment may be applied to large-sized electronic apparatuses, such as televisions, monitors, etc., and small and middle-sized electronic apparatuses, such as tablet personal computers, navigational units for vehicles, game consoles, smart watches, and the like.

Referring to FIG. 1, the front surface IS of the display apparatus DD includes an active area AA and a peripheral area NAA adjacent to (e.g., outside) the active area AA. The active area AA may be an area on which the image IM is displayed, and also, an external input TC may be detected.

The image IM may include a still image and/or a dynamic image. FIG. 1 illustrates icon images as an example of the image IM.

The external input TC includes a user's input TC applied from the outside. The user's input TC includes various types of external inputs, such as a portion of a user's body, light, heat, a pressure, and/or the like. It is also contemplated that the external input TC may be a near input, such as a hovering or approaching input. As seen in FIG. 1, the user's input TC is illustrated as a user's hand applied to the front surface IS.

The peripheral area NAA is an area on which the image IM is not displayed, or the external input TC is not sensed even though an electrical signal is applied. As illustrated in FIG. 1, the active area AA may have a rectangular shape. The peripheral area NAA may surround the active area AA. However, exemplary embodiments are not limited thereto. For example, the active area AA and the peripheral area NDA may be relatively designed in shape.

FIGS. 2A to 2D are cross-sectional views of the display apparatus of FIG. 1 according to an exemplary embodiment. For instance, FIGS. 2A to 2D illustrate cross-sections defined by the second directional axis DR2 and the third directional axis DR3. FIGS. 2A to 2D are simply illustrated to explain a lamination relationship of functional panels and/or functional units constituting the display apparatus DD.

The display apparatus DD according to an exemplary embodiment may include a display unit (or display panel), an input sensing unit (or input sensing sensor), an anti-reflection unit, and a widow. At least some portions of the display panel, the input sensing sensor, the anti-reflection unit, and the window may be formed through a continuous process, and at least some portions may be coupled to each other through an adhesion member. As such, it is to be understood that portions of a display apparatus DD formed through a continuous process do not use an adhesion member between adjacent components, e.g., layers, etc., formed through the continuous process. FIGS. 2A to 2D illustrate an optically clear adhesive (OCA) as an illustrative example of the adhesion member, but exemplary embodiments are not limited thereto. Hereinafter, the adhesion member may include a general adhesive or adhesive agent. In an exemplary embodiment, the anti-reflection unit and the window may be replaced with different constituents or omitted.

In FIGS. 2A to 2D, a corresponding constituent of the input sensing sensor, the anti-reflection unit, and the window that is formed with respect to the other constituent through the continuous process, may be expressed as a "layer." A constituent of the input sensing unit, the anti-reflection unit, and the window that is coupled to the other constituent through the adhesion member, may be expressed as a "panel." The "panel" may include a base layer providing a base surface, for example, a synthetic film, a complex material film, a glass substrate, and the like, but the base layer may be omitted in the "layer." That is to say, the units expressed as the "layer" may be disposed on the base surface provided by another unit, e.g., an underlying unit.

The display unit, the input sensing unit, the anti-reflection unit, and the window may be called a display panel DP, an input sensing panel ISP, an anti-reflection panel RPP, and a window panel WP or a display panel DP, an input sensing layer ISL, an anti-reflection layer RPL, and a window layer WL.

Figure 2A:
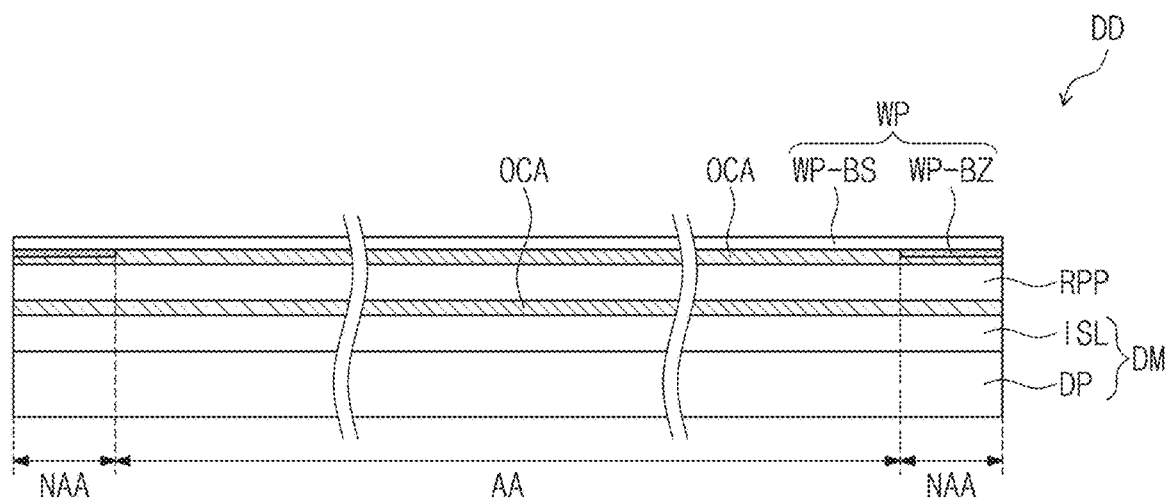
FIGS. 2A, 2B, 2C, and 2D are cross-sectional views of the display apparatus of FIG. 1 according to various exemplary embodiments.
Figure 2A:
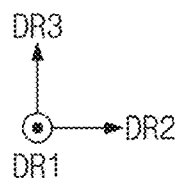

As illustrated in FIG. 2A, the display apparatus DD may include a display panel DP, an input sensing layer ISL, an anti-reflection panel RPP, and a window panel WP. The input sensing layer ISL is disposed directly on the display panel DP. For the purposes of this disclosure, when "a constituent B is disposed directly on a constituent A" it means that a separate adhesive layer/adhesive member is not disposed between the constituents A and B. The constituent B may be formed through the continuous process on a base surface provided by the constituent A after the constituent A is formed.

The display panel DP and the input sensing layer ISL disposed directly on the display panel DP may be defined as a display module DM. An optically clear adhesive (OCA) is disposed between the display module DM and the anti-reflection panel RPP and between the anti-reflection panel RPP and the window panel WP.

The display panel DP generates an image, and the input sensing layer ISL acquires (or detects) coordinate information of an external input TC (for example, a touch event or touch interaction). Although not separately shown, the display module DM according to an exemplary embodiment may further include a protection member disposed on a bottom surface of the display panel DP. The protection member and the display panel DP may be coupled to each other through an adhesion member. The display apparatus DD of FIGS. 2B to 2D, which will be described below, may also further include the protection member.

The display panel DP according to an exemplary embodiment may be an emission-type display panel, but is not limited thereto. For example, the display panel DP may be an organic light emitting display panel or a quantum dot light emitting display panel. The organic light emitting display panel may include an organic light emitting material. A light emitting layer of the quantum dot light emitting display panel may include a quantum dot, a quantum rod, and/or the like. Hereinafter, the display panel DP will be described as the organic light emitting display panel.

The anti-reflection panel RPP reduces reflectance of external light incident from an upper side of the window panel WP. The anti-reflection panel RPP according to an exemplary embodiment may include a retarder and a polarizer.

The retarder may be a film-type or liquid crystal coating-type retarder and may include a $\lambda/2$ retarder and/or a $\lambda/4$ retarder. The polarizer may also be a film-type or liquid crystal coating-type polarizer. The film-type may include an elongation-type synthetic resin, and the liquid crystal coating-type may include liquid crystals that are arranged in a predetermined arrangement. Each of the retarder and the polarizer may further include a protection film. The retarder and polarizer itself or the protection film may be defined as a base layer of the anti-reflection panel RPP.

The anti-reflection panel RPP according to an exemplary embodiment may include color filters. The color filters may have a predetermined arrangement. The color filters may be determined in arrangement in consideration of colors of light emitted from pixels provided by the display panel DP. The anti-reflection panel RPP may further include a black matrix adjacent to the color filters.

The anti-reflection panel RPP according to an exemplary embodiment may include a destructive interference structure. For example, the destructive interference structure may include a first reflection layer and a second reflection layer that are disposed on (or in) layers different from each other. First reflected light and second reflected light that are respectively reflected from the first reflection layer and the second reflection layer, may destructively interfere, and, thus, the external light may be reduced in reflectance.

The window panel WP according to an exemplary embodiment includes a base layer WP-BS and a light blocking pattern WP-BZ. The base layer WP-BS may include a glass substrate and/or a synthetic film. The base layer WP-BS is not limited to a single layer. The base layer WP-BS may include two or more films that are coupled to each other through an adhesion member.

The light blocking pattern WP-BZ partially overlaps the base layer WP-BS. The light blocking pattern WP-BZ is disposed on a rear surface of the base layer WP-BS; The light blocking pattern WP-BZ may be disposed corresponding to the peripheral area NAA of the display apparatus DD. An area on which the light blocking pattern WP-BZ is not disposed active area AA of the display apparatus DD.

The light blocking pattern WP-BZ may be a colored organic film, for example, formed in a coating manner. Although not shown, the window panel WP may further include a functional coating layer disposed on an entire surface of the base layer WP-BS. The functional coating layer may include an anti-fingerprint layer, an anti-reflection layer, a hard coating layer, and/or the like. Hereinafter, referring to FIGS. 2B to 2D, the window panel WP and the window layer WL will be simply illustrated without distinguishing the base layer WP-BS and the light blocking pattern WP-BZ from each other.

Figure 2B:
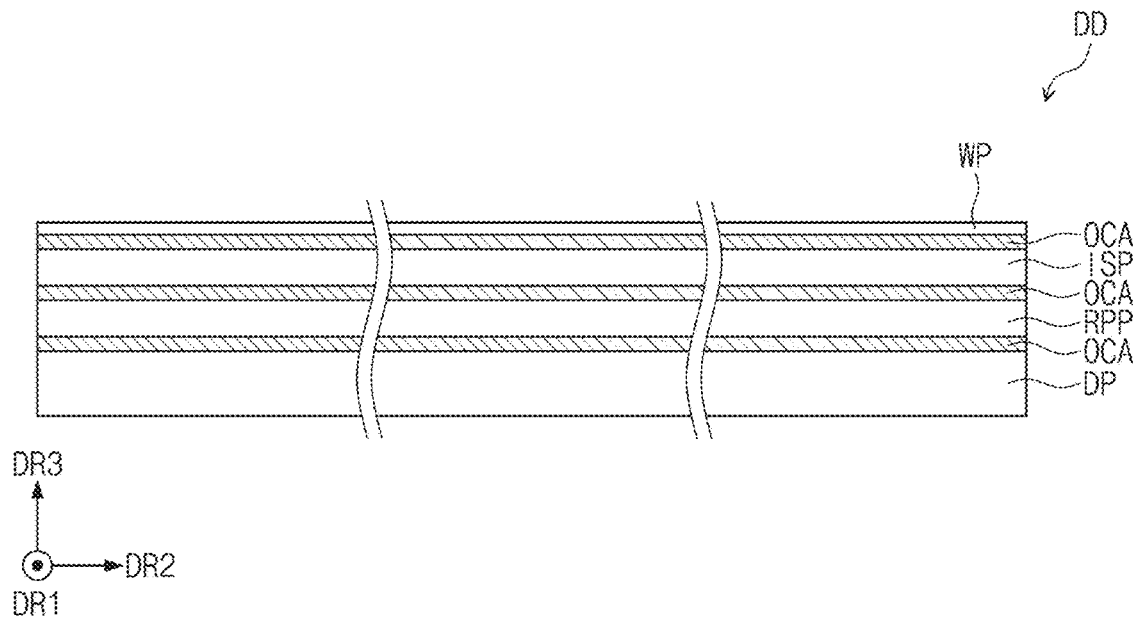
Figure 2B:
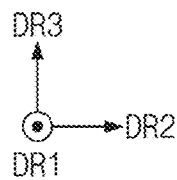
Figure 2C:
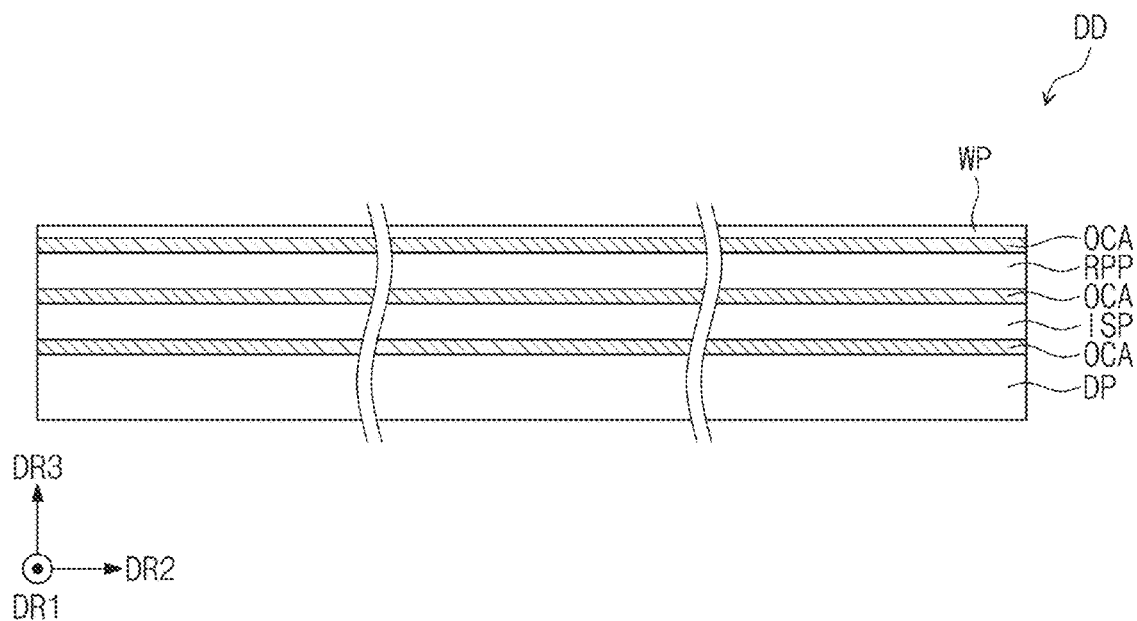

As illustrated in FIGS. 2B and 2C, the display apparatus DD may include the display panel DP, the input sensing panel ISP, the anti-reflection panel RPP, and the window panel WP. A laminated order of the input sensing panel ISP and the anti-reflection panel RPP may be changed as can be appreciated in a comparison of FIG. 2B with FIG. 2C.

Figure 2D:
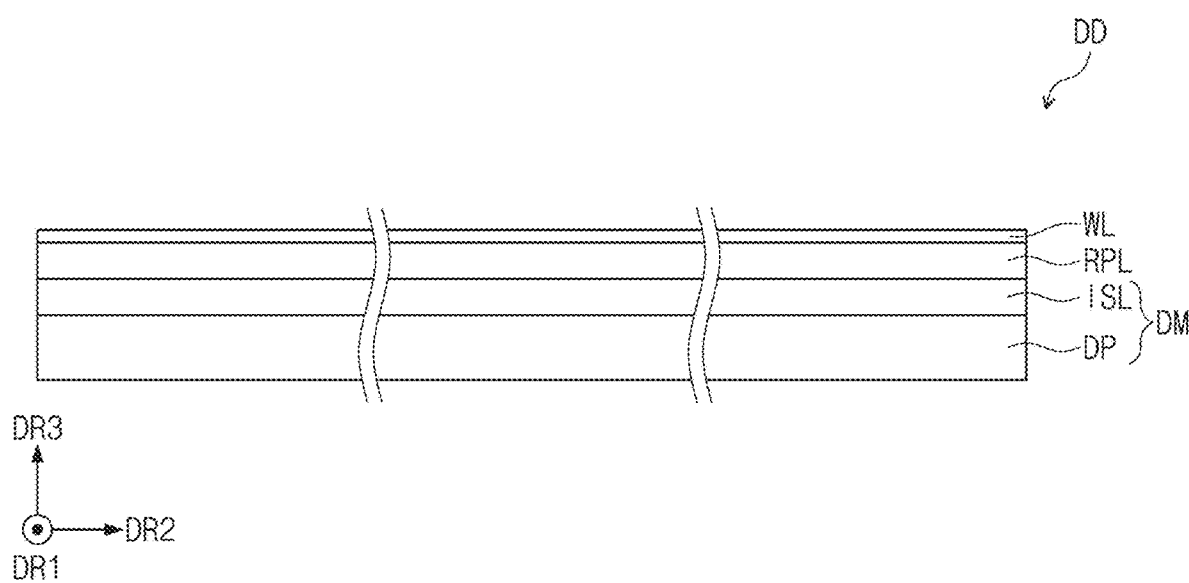

As illustrated in FIG. 2D, the display apparatus DD may include the display panel DP, the input sensing layer ISL, the anti-reflection layer RPL, and the window layer WL. The adhesion members may be omitted from the display apparatus DD, and the input sensing layer ISL, the anti-reflection layer RPL, and the window layer WL may be formed on a base surface provided via the display panel DP through a continuous process. Although not illustrated, a laminated order of the input sensing layer ISL and the anti-reflection panel RPP may be changed, such as in a manner similar to FIGS. 2B and 2C.

Figure 3A:
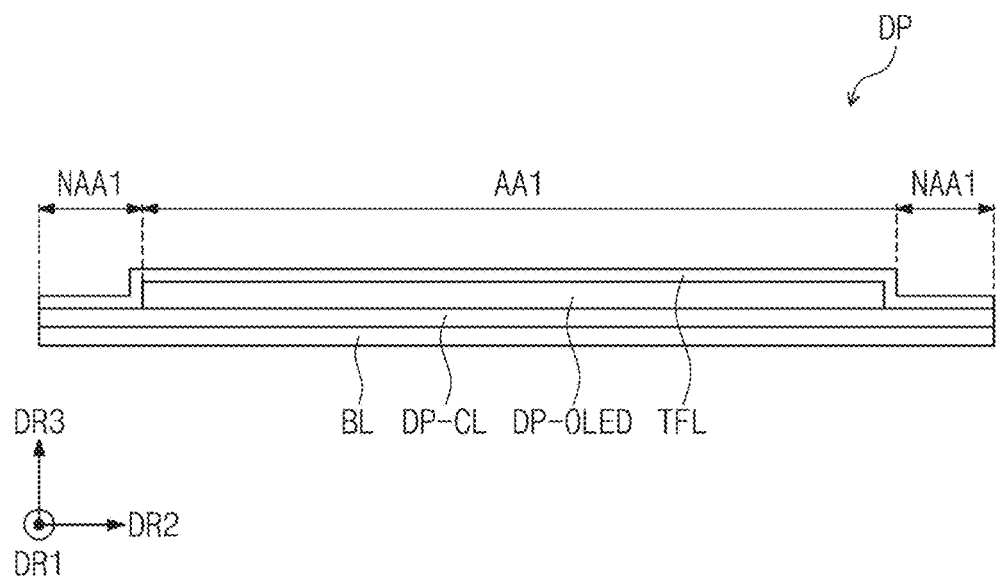
FIGS. 3A and 3B are cross-sectional views illustrating a portion of a display panel of the display apparatus of FIG. 1 according to various exemplary embodiments.
Figure 3B:
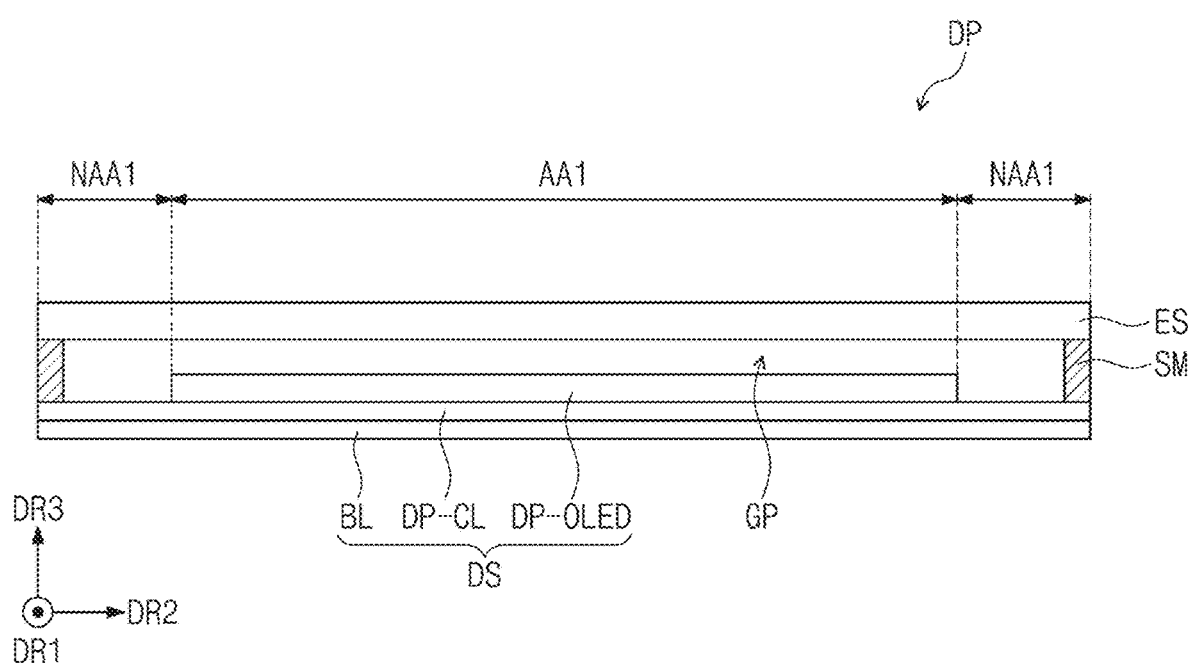

FIGS. 3A and 3B are cross-sectional views illustrating a portion of the display apparatus DD according to various exemplary embodiments. The display panel DP may correspond to a display unit that will be described later. In an exemplary embodiment, an area that corresponds to an area may mean that the areas overlap each other and have the same surface area, but is not limited thereto. Hereinafter, this will be described later in more detail.

As illustrated in FIG. 3A, a display panel DP may include a base layer BL, a circuit element layer DP-CL disposed on the base layer BL, a display element layer DP-OLED, and an upper insulation layer TFL.

A display area AA1 and a non-display area DP-NDA, which correspond to the active area AA and the peripheral area NAA of FIG. 1, may be defined on (or by) the display panel DP. In an exemplary embodiment, that an area corresponds to another area may mean that the areas overlap each other and have the same surface area, but is not limited thereto.

The base layer BL may include at least one plastic film. The base layer BL may include at least one of a plastic substrate, a glass substrate, a metal substrate, and an organic/inorganic composite substrate.

The circuit element layer DP-CL includes at least one intermediate insulation layer and a circuit device. The intermediate insulation layer includes at least one intermediate inorganic film and at least one intermediate organic film. The circuit element includes signal lines, a driving circuit of the pixel, and the like. This will be described later in more detail.

The display element layer DP-OLED may include organic light emitting diodes. The display element layer DP-OLED may further include an organic film, such as a pixel defining layer.

The upper insulation layer TFL may include a plurality of thin films. One portion of the thin films may be disposed to improve optical efficiency, and the portion of the thin films may be disposed to protect the organic light emitting diodes. The upper insulation layer TFL will be described later in more detail.

As illustrated in FIG. 3B, the display panel DP may include a base layer BL, a circuit element layer DP-CL disposed on the base layer BL, a display element layer DP-OLED, an encapsulation layer ES, and a sealant SM coupling the base layer BL to the encapsulation layer ES. The encapsulation layer ES may be spaced a predetermined gap GP from the display element layer DP-OLED. Each of the base layer BL and the encapsulation layer ES may include at least one of a plastic substrate, a glass substrate, a metal substrate, and an organic/inorganic composite substrate. The sealant SM may include an organic adhesion member or frit.

Figure 4:
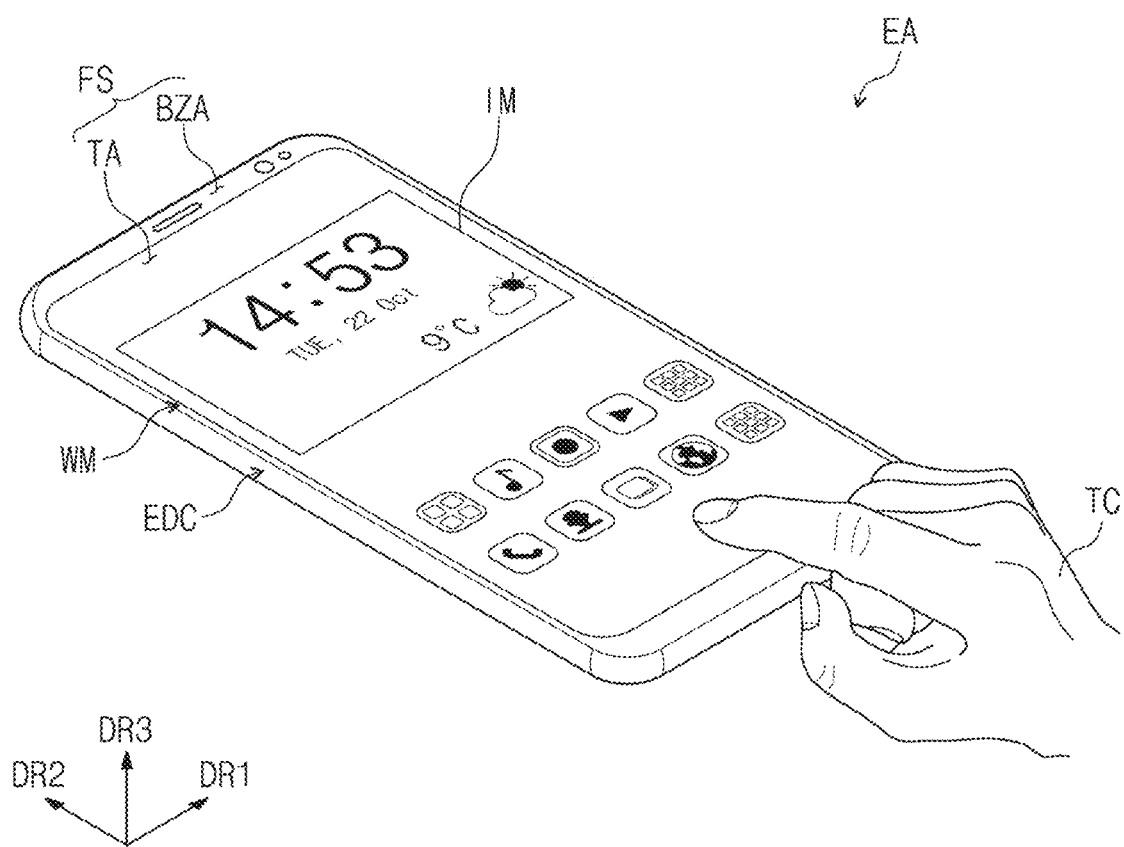
FIG. 4 is a perspective view of an electronic apparatus according to an exemplary embodiment.
Figure 5A:
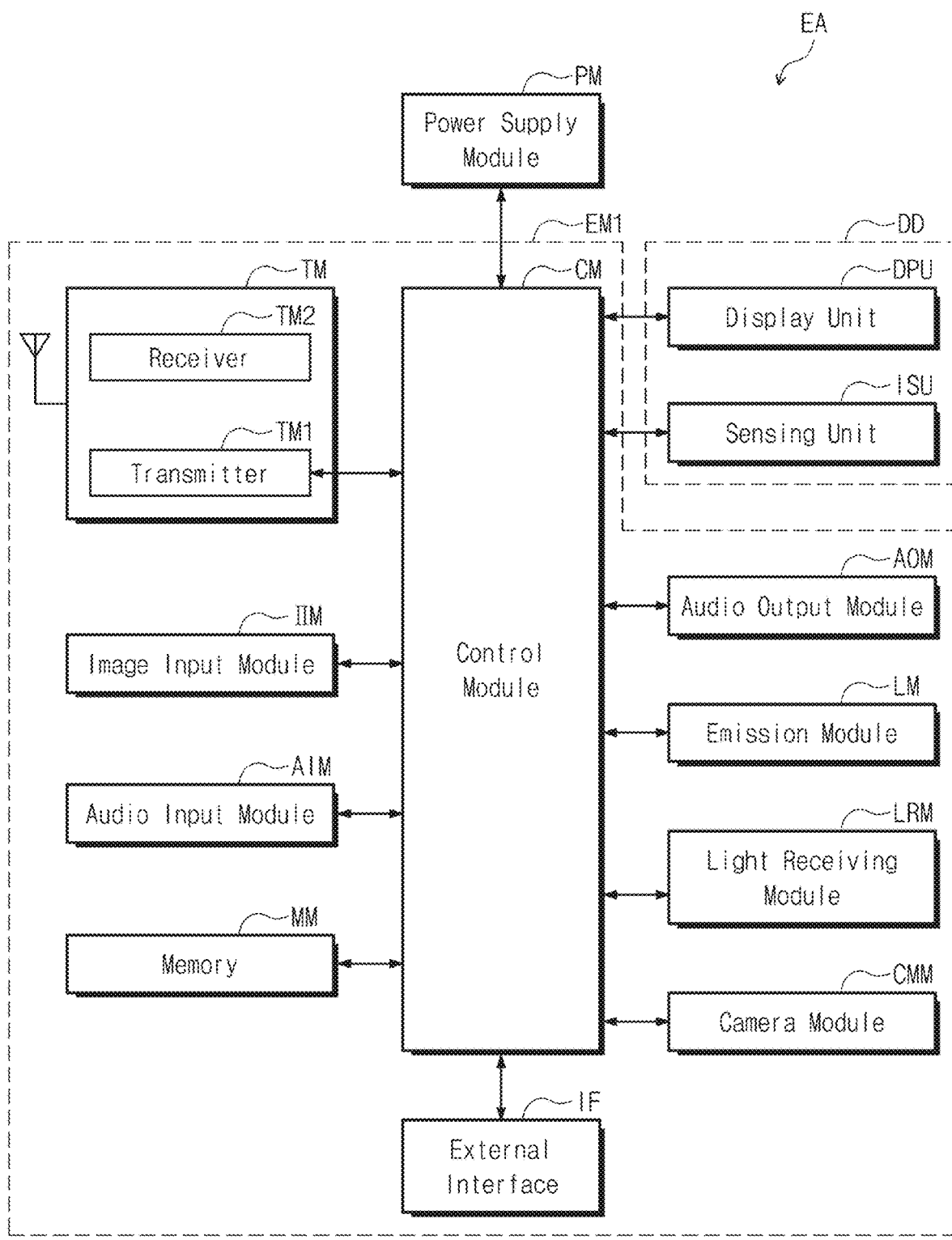
FIG. 5A is a block diagram of the electronic apparatus of FIG. 4 according to an exemplary embodiment.
Figure 5B:
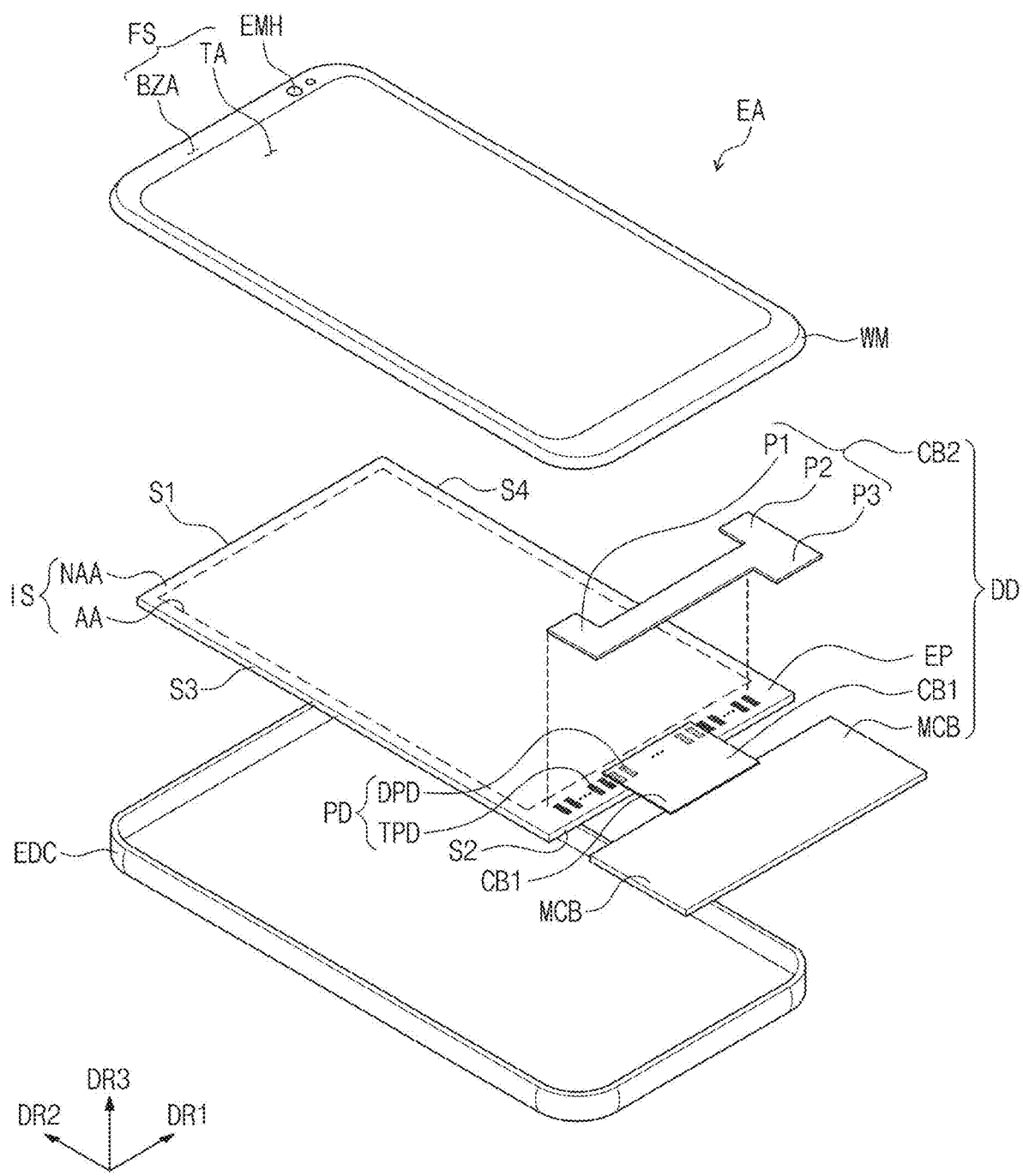
FIG. 5B is an exploded perspective view of the electronic apparatus of FIG. 4 according to an exemplary embodiment.

FIG. 4 is a perspective view of an electronic device according to an exemplary embodiment. FIG. 5A is a block diagram of the electronic apparatus of FIG. 4 according to an exemplary embodiment. FIG. 5B is an exploded perspective view of the electronic apparatus of FIG. 4 according to an exemplary embodiment. Hereinafter, various exemplary embodiments will be described with reference to FIGS. 1 to 5B.

According to an exemplary embodiment, an electronic apparatus EA including a smart phone will be described as an example. The electronic apparatus EA may display an image IM in the third direction DR3 on a display surface FS parallel to each of the first and second directions DR1 and DR2. The display surface FS on which the image IM is displayed may correspond to a front surface of the electronic apparatus EA.

The electronic apparatus EA according to an exemplary embodiment may sense a user's input TC applied from the outside. However, this is merely an example. For example, the electronic apparatus EA may sense the user's input TC applied to a side surface or a rear surface of the electronic apparatus EA according to the structure of the electronic apparatus EA. Here, the active area AA may be expanded up to the side surface and/or the rear surface of the electronic apparatus EA. The electronic apparatus EA according to an exemplary embodiment may be designed to have various shapes, but is not limited to a specific configuration or shape.

Referring to FIG. 5A, the electronic apparatus EA may include a power supply module PM, a display apparatus DD, an electronic module EM1, a bracket, and an external case EDC (see FIG. 4). The power supply module PM supplies power for an overall operation of the electronic apparatus EA. The power supply module PM may include a general battery module.

The display apparatus DD is disposed on a rear surface of the window member WM. The display apparatus DD may include a display panel unit DPU and an input sensing unit ISU. The display panel unit DPU may correspond to the above-described display panel DP, and the input sensing unit ISU may correspond to the input sensing layer ISL or the input sensing panel ISP. Thus, as described above, the display apparatus DD may display the image IM and sense the external input TC.

For example, the display panel unit DPU may be configured to substantially generate the image IM. The image IM generated by the display panel unit DPU may be displayed on the display surface FS through the transmission area TA so as to be visible to an external user.

The input sensing unit ISU senses the external input TC applied from the outside. As described above, the input sensing unit ISU may sense the external input TC provided to the window member WM.

Referring to FIG. 5B, the electronic apparatus EA is schematically illustrated based on the display apparatus DD. For example, the electronic apparatus EA may include a window member WM, a display apparatus DD, and an external case EDC. The display apparatus DD may include an electronic panel EP, a main circuit board MCB, a first circuit board CB1, and a second circuit board CB2.

The window member WM may include an insulation panel. For example, the window member WM may be made of glass, plastic, or a combination thereof. A front surface FS of the window member WM may define the front surface of the electronic apparatus EA as described above.

The transmission area TA may be an optically transparent area. For example, the transmission area TA may be an area having a visible light transmittance of about 90% or more, but exemplary embodiments are not limited thereto.

The bezel area BZA may be an area having light transmittance that is relatively less than that of the transmission area TA. The bezel area BZA defines a shape of the transmission area TA. The bezel area BZA may be disposed adjacent to the transmission area TA to surround the transmission area TA. The bezel area BZA may have a predetermined color. The bezel area BZA may cover the peripheral area NAA of the electronic panel EP to prevent the peripheral area NAA from being visible from the outside. However, this is merely an example. For instance, in the window member WM according to an exemplary embodiment, the bezel area BZA may be omitted. It is also contemplated that the bezel area BZA may include one or more openings, e.g., electronic module opening EMH, exposing an underlying electronic module, such as a camera module, a sensor module, etc.

The electronic panel EP includes a front surface IS including an active area AA and a peripheral area NAA. The front surface IS of the electronic panel EP may correspond to the front surface IS of the display apparatus DD of FIG. 1. As seen in FIG. 5B, the electronic panel EP may have a rectangular shape having upper and lower sides S1 and S2 that extend in the first direction DR1 and are opposed to each other in the second direction DR2, and left and right sides S3 and S4 that extend in the second direction DR2 and are opposed to each other in the first direction DR1.

As described above, the active area AA may be an area that is activated according to an electrical signal. In an exemplary embodiment, the electronic panel EP may be a constituent on which the image IM generated by a display panel unit DPU (see FIG. 6A) and an input sensing area provided by an input sensing unit ISU (see, e.g., FIGS. 6B and 6C) are provided.

The transmission area TA overlaps at least the active area AA. For example, the transmission area TA overlaps an entire surface of at least a portion of the active area AA. Thus, a user may see the image IM through the transmission area TA or provide the external input TC on the transmission area TA. However, this is merely an example. For example, an area of the active area AA, on which the image IM is displayed, and an area of the active area AA, on which the external input TC is sensed, may be separated from each other, and as such, exemplary embodiments are not limited to a specific configuration of the active area AA.

The peripheral area NAA may be an area covered by the bezel area BZA. The peripheral area NAA is adjacent to the active area AA. The peripheral area NAA may surround the active area AA. A driving circuit or a driving line for driving the active area AA may be disposed on the peripheral area NAA.

A plurality of pads PD is schematically illustrated on the peripheral area NAA. The pads PD are arranged to be spaced apart from each other in the first direction DR1. In an exemplary embodiment, the pads PD may include a plurality of display panel pads DPD and a plurality of input sensing pads TPD.

The display panel pads DPD are connected to the first circuit board CB1. The display panel pads DPD are illustrated in a state of being covered by the first circuit board CB1 and shaded for convenience of description.

The input sensing pads TPD are exposed from the first circuit board CB1 and connected to the second circuit board CB2. The input sensing pads TPD may be disposed on two separated areas with the display panel pads DPD connected to the first circuit board CB1 disposed therebetween. However, this is merely an example. For example, the input sensing pads TPD may be disposed to be biased (or arranged) to one side of the display panel pads DPD, but is not limited thereto.

The first circuit board CB1 and the second circuit board CB2 may be connected to the pads PD and electrically connected to the display apparatus DD. The first circuit board CB1 and the second circuit board CB2 may be connected to ones of the pads PD that are different from each other.

The first circuit board CB1 is connected to the display panel pads DPD. The first circuit board CB1 may be a flexible circuit board. The first circuit board CB1 may be electrically connected to the display panel unit DPU of the display apparatus DD through the display panel pads DPD.

The second circuit board CB2 is connected to the input sensing pads TPD. The second circuit board CB2 may be a flexible circuit board. The second circuit board CB2 may be electrically connected to the input sensing unit ISU of the electronic panel EP through the input sensing pads TPD.

The second circuit board CB2 may include first to third cutoff parts (or first to third portions) P1, P2, and P3. The first cutoff part P1 and the second cutoff part P2 may be spaced apart from each other in the first direction DR1 and respectively connected to the input sensing pads TPD that are divided into two areas. The second circuit board CB2 according to an exemplary embodiment includes the first and second cutoff parts P1 and P2 spaced apart from each other, and, thus, may be easily connected to the input sensing pads TPD arranged to be divided into two areas.

The third cutoff part P3 extends in a direction opposite to that of each of the first cutoff part P1 and the second cutoff part P2. The third cutoff part P3 may be connected to the main circuit board MCB. Although not shown, a predetermined connector to be connected to the main circuit board MCB may be further disposed on the third cutoff part P3. The second circuit board CB2 may include the third cutoff part P3, and, thus, may be easily connected to the main circuit board MCB.

The main circuit board MCB may include various driving circuits for driving the electronic panel EP and a connector for supplying power. The first circuit board CB1 and the second circuit board CB2 may be connected to the main circuit boards MCB, respectively. According to an exemplary embodiment, the electronic panel EP may be easily controlled through one main circuit board MCB. However, this is merely an example. In the electronic panel EP according to an exemplary embodiment, the input sensing unit ISU and the display panel unit DPU may be connected to main circuit boards different from each other, and one of the first circuit board CB1 and the second circuit board CB2 may not be connected to the main circuit board MCB, but exemplary embodiments are not limited to a specific configuration.

According to an exemplary embodiment, the electronic panel EP may be assembled in a state in which the active area AA and the peripheral area NAA are flat and facing the window member WM. However, this is merely an example. For example, a portion of the peripheral area NAA of the electronic panel EP may be bent. Here, a portion of the peripheral area NAA may be disposed to face a rear surface of the electronic apparatus EA to reduce an area of the bezel area BZA on the front surface FS of the electronic apparatus EA. Additionally or alternatively, the electronic panel EP may be assembled in a state in which a portion of the active area AA is bent. In the electronic panel EP according to an exemplary embodiment, the peripheral area NAA may be omitted.

Referring again to FIG. 5A, the electronic module EM1 includes various functional modules for driving the electronic apparatus EA. The electronic module EM1 may be directly mounted on the main circuit board MCB electrically connected to the electronic panel EP or mounted on a separate substrate and then electrically connected to the main circuit board MCB through a connector (not shown).

The electronic module EM1 may include a control module CM, a wireless communication module TM, an image input module IIM, an audio input module AIM, a memory MM, an external interface IF, an audio output module AOM, an emission module (e.g., a light emitting module) LM, a light receiving module LRM, and a camera module CMM.

The control module CM controls the overall operation of the electronic apparatus EA. The control module CM may be a microprocessor. For example, the control module CM may activate or inactivate the electronic panel EP. The control module CM may control other modules, such as the image input module IIM or the audio input module AIM, on the basis of a touch signal received from the electronic panel EP.

The wireless communication module TM may transmit/receive (e.g., transceive) a wireless signal to/from another other terminal, base station, access point, etc., using, for instance, a Bluetooth™ or Wi-Fi line. The wireless communication module TM may transmit/receive an audio signal using a general communication line. The wireless communication module TM includes a transmitter TM1 modulating and transmitting a signal to be transmitted and a receiver TM2 demodulating the received signal.

The image input module IIM processes an image signal to convert the processed image signal into image data that is capable of being displayed on the electronic panel EP. The audio input module AIM receives external audio signals using a microphone during a recording mode or a voice recognition mode to convert the received audio signal into electrical sound data.

The external interface IF serves as an interface to connect to an external charger, a wired/wireless data port, and/or a card socket (for example, a memory card and an subscriber identity module (SIM)/user identity module (UIM) card).

The audio output module AOM converts audio data received from the wireless communication module TM or audio data stored in the memory MM to output the converted audio data to the outside.

The emission module LM generates and outputs light. The emission module LM may output infrared rays. The emission module LM may include a light-emitting diode (LED).

The light receiving module LRM may sense infrared rays. The light receiving module LRM may be activated when infrared rays having a predetermined level or more are sensed. The light receiving module LRM may include a complementary metal oxide semiconductor (CMOS) sensor. The infrared rays generated in the emission module LM may be output and then may be reflected by an external object (for example, a user's finger or face), and the reflected infrared rays may be incident into the light receiving module LRM. The camera module CMM photographs an external image.

Referring again to FIG. 5B, the external case EDC may be coupled to the window member WM. The external case EDC defines an outer appearance of the electronic apparatus EA. Although not shown, an accommodation member or bracket may be coupled to the window member WM and/or the external case EDC to define an inner space.

The external case EDC may include a material having relatively high rigidity. For example, the external case EDC may include a plurality of frames and/or plates that are made of glass, plastic, and/or a metal. The external case EDC may stably protect the constituents of the electronic apparatus EA that are accommodated in the inner space against an external impact and/or debris. Various constituents constituting the electronic apparatus EA may be accommodated in the inner space of the external case EDC.

Figure 6A:
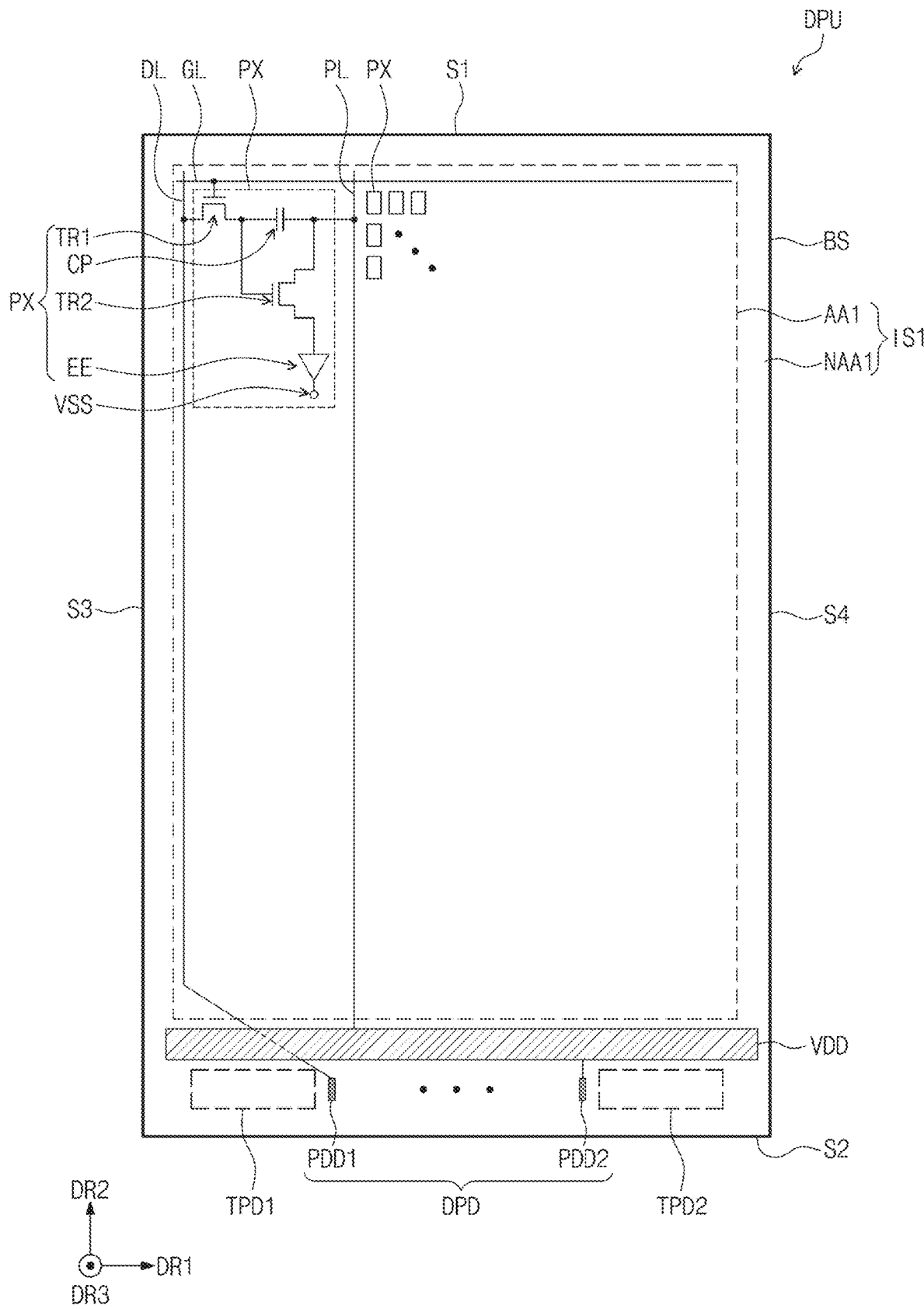
FIGS. 6A, 6B, and 6C are plan views illustrating a portion of some constituent components of an electronic panel according to various exemplary embodiments.
Figure 6B:
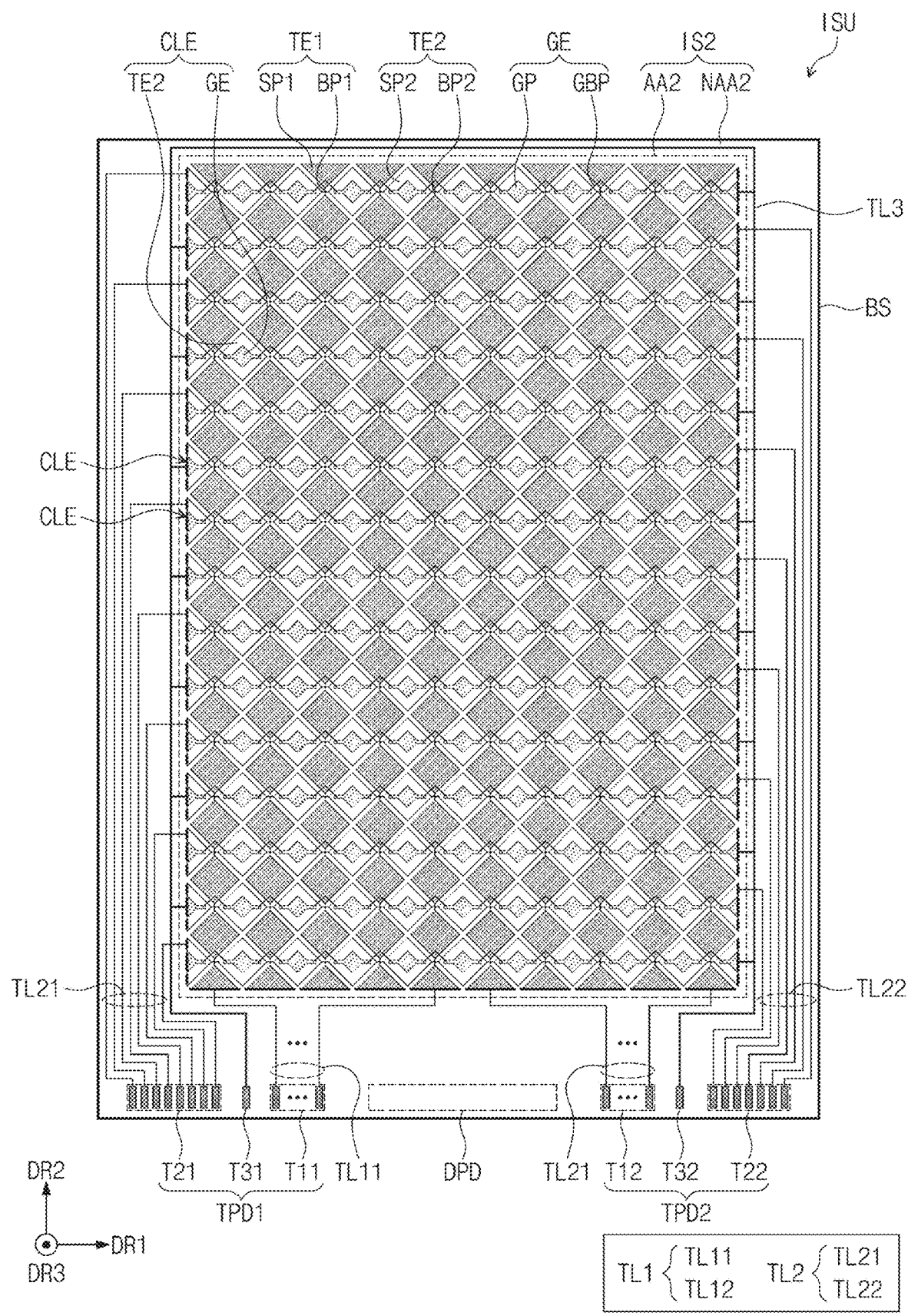
Figure 6C:
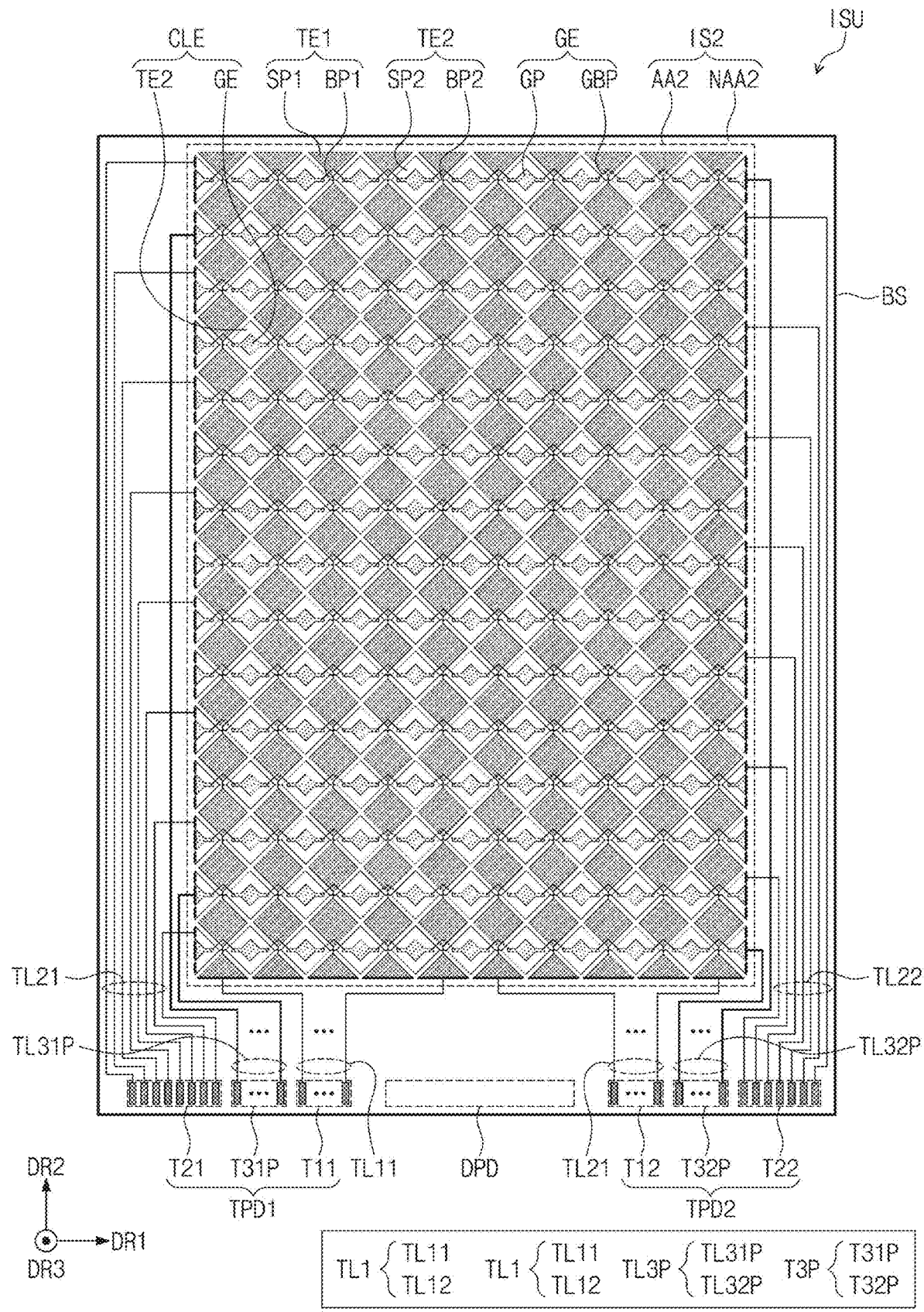

FIGS. 6A to 6C are plan views illustrating a portion of some constituent components of an electronic panel according to various exemplary embodiments. For convenience of description, FIG. 6A illustrates a schematic plan view of the display panel unit DPU according to an exemplary embodiment, and FIG. 6B illustrates a schematic plan view of the input sensing unit ISU according to an exemplary embodiment. FIG. 6C is a plan view of an input sensing unit ISU_P according to an exemplary embodiment. Hereinafter, various exemplary embodiments will be described with reference to FIGS. 6A to 6C. The same reference numerals may be given to components that are the same as those of FIGS. 1 to 5B, and their detailed descriptions will be omitted.

As illustrated in FIG. 6A, the display panel unit DPU may include a plurality of signal lines GL, DL, and PL, a plurality of pixels PX, a power source pattern VDD, and a plurality of display panel pads DPD. Constituents of the display panel unit DPU may be disposed on a base substrate BS. For convenience of description, FIG. 6A illustrates a schematic signal circuit diagram of one pixel PX. Here, signal lines GL, DL, and PL connected to one pixel PX are illustrated.

The base substrate BS may provide a front surface IS1 including a first area AA1 and a first peripheral area NAA1. The first area AA1 may correspond to the active area AA (see FIG. 5B), and the first peripheral area NAA1 may correspond to the peripheral area NAA (see FIG. 5B).

The signal lines GL, DL, and PL may include a scan line GL, a data line DL, and a power line PL. The scan line GL transmits a scan signal to the pixel PX. The pixel PX may be turned on/off in response to the scan signal. The data line DL transmits a data signal to the pixel PX. The pixel PX may display an image corresponding to the data signal. The power line PL transmits a power signal (hereinafter, referred to a first power signal) to the pixel PX. This, however, is merely an example. For instance, the signal lines GL, DL, and PL may further include other signal lines additionally connected to the pixel PX in addition to the scan line GL, the data line DL, and the power line PL, and, as such, exemplary embodiments are not limited to a specific configuration of signal lines.

The pixel PX may be provided in plurality and arranged on the first area AA1. A signal circuit diagram of one pixel PX of the plurality of pixels illustrated as an example. The pixel PX may include a first thin film transistor TR1, a capacitor CP, a second thin film transistor TR2, and a light emitting element EE.

The first thin film transistor TR1 may be a switching device that controls turn-on/off of the pixel PX. The first thin film transistor TR1 may transmit or block the data signal transmitted through the data line DL in response to the scan signal transmitted through the scan line GL.

The capacitor CP is connected to the first thin film transistor TR1 and the power line PL. The capacitor CP charges electrical charges by an amount corresponding to a difference between the data signal received from the first thin film transistor TR1 and a first power signal applied to the power line PL.

The second thin film transistor TR2 is connected to the first thin film transistor TR1, the capacitor CP, and the light emitting element EE. The second thin film transistor TR2 controls a driving current flowing through the light emitting element EE to correspond to an amount of charge stored in the capacitor CP. A turn-on time of the second thin film transistor TR2 may be determined according to the amount of charge charged in the capacitor CP. The second thin film transistor TR2 provides the first power signal transmitted through the power line PL during the turn-on time to the light emitting element EE.

The light emitting element EE may generate light or control an amount of light according to the electrical signal. For example, the light emitting element EE may include an organic light emitting element, a quantum dot light emitting element, an electrophoretic element, an electrowetting element, or the like.

The light emitting element EE may be connected to a power source terminal VSS to receive a power signal (hereinafter, referred to as a second power signal) different from the first power signal provided by the power line PL. Driving current corresponding to a difference between the electrical signal provided from the second thin film transistor TR2 and the second power signal may flow through the light emitting element EE, and the light emitting element EE may generate light corresponding to the driving current. However, this is merely an example. For instance, the pixel PX may include electronic elements having various configurations and arrangements, and, as such, exemplary embodiments are not limited to a specific configuration of the pixel PX.

The power source pattern VDD is disposed on the first peripheral area NAA1. In an exemplary embodiment, the power source pattern VDD is connected to the plurality of power lines PL. Thus, the display panel unit DPU may include the power source pattern VDD to provide the same first power signal to the plurality of pixels.

The display panel pads DPD are disposed on the first peripheral area NAA1. As described above, the first circuit board CB1 (see FIG. 5B) is electrically connected to the display panel unit DPU through the display panel pads DPD. The display panel pads DPD may be connected to one of the signal lines connected to the pixel PX. For example, the display panel pads DPD may include a first pad PDD1 connected to the data line DL and a second pad PDD2 connected to the power source pattern VDD. However, this is merely an example. For instance, the display panel pads DPD may further include a pad connected to the scan line GL and/or pads connected to other signal lines (not shown), and, as such, exemplary embodiments are not limited to a specific configuration and connections of the display panel pads DPD.

Referring to FIG. 6B, the input sensing unit ISU is disposed on the base substrate BS. The input sensing unit ISU may be disposed on the display panel unit DPU, disposed between the display panel unit DPU and the base substrate BS, or spaced apart from the display panel unit DPU with the base substrate BS disposed therebetween. In an exemplary embodiment, the base substrate BS may correspond to the upper insulation layer TFL (see, e.g., FIG. 3A).

The input sensing unit ISU includes a plurality of first electrodes TE1, a plurality of second electrodes TE2, a plurality of third electrodes GE, a plurality of signal lines TL11, TL12, TL21, TL22, and TL3, and a plurality of input sensing pads TPD1 and TPD2.

The first electrodes TE1, the second electrodes TE2, and the third electrodes GE are disposed on the first area AA2 of the front surface IS2 of the input sensing unit ISU. The first area AA2 may overlap the first area AA1 of the display panel unit DPU and correspond to the active area AA of the electronic panel EP.

The signal lines TL11, TL12, TL21, TL22, and TL3 and the input sensing pads TPD1 and TPD2 are disposed on the second area NAA2 of the front surface IS2. The second area NAA2 may overlap the first peripheral area NAA1 of the display panel unit DPU and correspond to the peripheral NAA of the electronic panel EP.

The signal lines TL11, TL12, TL21, TL22, and TL3 may include a plurality of first sensing lines TL11 and TL12, a plurality of second sensing lines TL21, TL22, and a third sensing line TL3. The input sensing pads TPD1 and TPD2 may correspond to the input sensing pads TPD of FIG. 5B. The input sensing pads TPD1 and TPD2 may include a first sensing pad group TPD1 and a second sensing pad group TPD2 disposed on the divided areas.

The first electrodes TE1 are arranged in (e.g., spaced apart from one another in) the first direction DR1. Each of the first electrodes TE1 extends in the second direction DR2. Each of the first electrodes TE1 may include a plurality of first sensing patterns SP1 and a plurality of first connection patterns BP1.

Each of the first sensing patterns SP1 and the first connection patterns BP1 may be arranged in the second direction DR2. Each of the first connection patterns BP1 is disposed between adjacent ones of the first sensing patterns SP1. The first sensing patterns SP1 are electrically connected through the first connection patterns BP1.

The first sensing lines TL1 are connected to the first electrodes TE1, respectively. The first sensing lines TL1 connect the first electrodes TE1 to some of the input sensing pads TPD, which correspond to the first electrodes TE1, of the first pads T11 and T12, respectively.

In an exemplary embodiment, the first sensing lines TL1 may include first lower sub lines TL11 and second lower sub lines TL12. The first lower sub lines TL11 connect a portion of the first electrodes TE1 to a portion T11 of the first pads T11 and T12. The second lower sub lines TL12 connect a remaining portion of the first electrodes TE1 to a remaining portion T12 of the first pads T11 and T12.

The first sensing lines TL1 may transmit the electrical signal provided through the first pads T11 and T12 to the first electrodes TE1 or may transmit electrical signals provided from the first electrodes TE1 to the outside through the first pads T11 and T12. However, this is merely an example. For instance, the first pads T11 and T12 may be continuously arranged on one side of the display panel pads DPD, and, as such, exemplary embodiments are limited to a specific configuration of the first pads T11 and T12.

The second electrodes TE2 are arranged in (e.g., spaced apart from one another in) the second direction DR2. Each of the second electrodes TE2 extends in the first direction DR1. Each of the second electrodes TE2 may include a plurality of second sensing patterns SP2 and a plurality of second connection patterns BP2.

The second sensing patterns SP2 and the second connection patterns BP2 may be arranged in the first direction DR1. Each of the second connection patterns BP2 is disposed between adjacent ones of the second sensing patterns SP2. The second sensing patterns SP2 are electrically connected through the second connection patterns BP2.

The second sensing lines TL21 and TL22 are connected to the second electrodes TE2, respectively. The second sensing lines TL21 and TL22 connect the second electrodes TE2 to the second sensing pads T21 and T22. The second sensing lines TL21 and TL22 may include first sub lines TL21 and second sub lines TL22.

The first sub lines TL21 may be disposed at a left side of the second area AA2 and connected to a portion of the second electrodes TE2. Each of the first sub lines TL21 may be connected to one side of a portion of the second electrodes TE2. In an exemplary embodiment, each of the first sub lines TL21 may be connected to one side of each of the second electrodes TE2 disposed in odd-numbered rows of the second electrodes TE2.

The second sub lines TL22 may be disposed at a right side of the second area AA2 and connected to the other portion of the second electrodes TE2. The second sub lines TL22 are connected to the other sides of the remaining electrodes of the second electrodes TE2. In an exemplary embodiment, each of the second sub lines TL22 may be connected to one side of each of the second electrodes TE2 disposed in even-numbered rows of the second electrodes TE2. The other side may be opposed to the one side in the first direction DR1.

The second electrodes TE2 connected to the second sub lines TL22 of the second electrodes TE2 may be electrodes that are not connected to the first sub lines TL21. That is, in an exemplary embodiment, each of the second electrodes TE2 may be selectively connected to one line of the first sub lines TL21 and the second sub lines TL22.

The second sensing lines TL21 and TL22 may transmit the electrical signal provided through the second sensing pads T21 and T22 to the second electrodes TE2 or may transmit electrical signals provided from the second electrodes TE2 to the outside through the second sensing pads T21 and T22.

The second electrodes TE2 may receive an electrical signal different from that applied to the first electrodes TE1. Here, the second electrodes TE2 may generate electric fields together with the first electrodes TE1. The input sensing unit ISU may sense the external input TC (see, e.g., FIG. 4) through a variation in capacitance formed between the second electrodes TE2 and the first electrodes TE1.

Alternatively, the second electrodes TE2 may receive the same electrical signal as the first electrodes TE1. Here, the input sensing unit ISU may sense the external input TC (see, e.g., FIG. 4) through a variation of capacitance generated in each of the second electrodes TE2 and the first electrode TE1 due to the external input TC.

The third electrodes GE are arranged in (e.g., spaced apart from one another in) the second direction DR2. Each of the third electrodes GE extends in the first direction DR1. Each of the third electrodes GE may include a plurality of conductive patterns GP and a plurality of conductive connection patterns GBP.

The conductive patterns GP and the conductive connection patterns GBP are arranged in the first direction DR1. The conductive connection patterns GBP are disposed between adjacent ones of the conductive patterns GP, respectively. However, this is merely an example. For instance, the third electrodes GE may be arranged in the first direction DR1, but exemplary embodiments are limited thereto.

The third electrodes GE may be spaced apart from the second electrodes TE2 in a plan view. Each of the conductive patterns GP may be respectively surrounded by a corresponding one of the second sensing patterns SP2. For instance, the conductive patterns GP may be respectively disposed in openings defined in the second sensing patterns SP2. The third connection patterns GBP may be disposed so that the third connection patterns GBP do not overlap the second connection patterns BP2 in a plan view. This will be described later in more detail. However, this is merely an example. For instance, each of the first to third electrodes TE1, TE2, and GE may have various shapes, but exemplary embodiments are not limited thereto.

The third sensing line TL3 is connected to the third electrodes GE, respectively. The third sensing line TL3 connects the third pad T31 and T32 to the third electrodes GE. The third pads T31 and T32 may be spaced apart from each other and respectively disposed on both sides of the display panel pads DPD, but exemplary embodiments are not limited thereto.

In an exemplary embodiment, the third sensing line TL3 may be provided as a single body. Thus, the plurality of third electrodes GE may be connected to each other through the single body third sensing line TL3. However, this is merely an example. For instance, the third sensing line TL3 may be provided as a plurality of third sensing lines TL3 that transmit the same electrical signal and respectively connect to corresponding pads of the input sensing pads TPD. The third sensing line TL3 according to an exemplary embodiment may have various shapes, and, as such, exemplary embodiments are not limited to a specific configuration of the third sensing line TL3.

According to an exemplary embodiment, the third sensing line TL3 is connected to one side of a portion of the third electrodes GE, and is also connected to the other side of the remaining electrodes of the third electrodes GE. For example, the third sensing line TL3 may be connected to a portion of the third electrodes GE at a left side of the second area AA2 and connected to the remaining electrodes of the third electrodes GE at a right side of the second area AA2. This will be described later in more detail.

The third sensing lines TL3 may transmit an electrical signal provided through the third pads T31 and T32 to the third electrodes GE. In an exemplary embodiment, the third sensing line TL3 may transmit an electrical signal different from that transmitted by each of the first and second sensing lines TL1 and TL2.

For example, in an exemplary embodiment, the third sensing line TL3 may receive a ground voltage. Thus, the third electrodes GE may maintain the ground voltage. The third electrodes GE may prevent a parasitic capacitance from being generated between the electrical constituents provided in the display panel unit DPU and the first or second electrodes TE1 or TE2. Thus, even though the input sensing unit ISU and the display panel unit DPU constitute one electronic panel EP, an occurrence of noise in the input sensing unit ISU due to the display panel unit DPU may be stably prevented (or at least reduced) to improve electrical reliability and sensitivity of the input sensing unit ISU.

The input sensing unit ISU according to an exemplary embodiment may include a plurality of row electrodes CLE sequentially arranged in a direction opposite to the second direction DR2. Each of the row electrodes CLE may be defined by the second electrodes TE2 and the third electrodes GE. For example, one row electrode CLE may be constituted by one second electrode TE2 extending in the first direction DR1 and the third electrode GE including a conductive pattern GP surrounded by the second sensing pattern SP2.

According to an exemplary embodiment, in one row electrode CLE, one side and the other side, which are opposed to each other in the first direction DR1, may be connected to sensing lines different from each other. For instance, one side of one row electrode CLE may be connected to one of the second sensing lines TL21 and TL22 and the third sensing line TL3, and the other side may be connected to the other of the second sensing lines TL21 and TL22 and the third sensing line TL3.

For instance, when one of the second sensing lines TL21 and TL22 is connected to a left side of the second electrode TE2 of one row electrode CLE, the third sensing line TL3 may be connected to a right side of the third electrode GE of the same row electrode CLE. Here, the sensing lines may not be connected to the right side of the second electrode TE2 and the left side of the third electrode GE. Alternatively, when one of the second sensing lines TL21 and TL22 is connected to the right side of the second electrode TE2 of one row electrode CLE, the third sensing line TL3 may be connected to the left side of the third electrode GE of the same row electrode CLE. Here, the sensing lines may not be connected to the left side of the second electrode TE2 and the right side of the third electrode GE.

As illustrated in FIG. 6C, in an input sensing unit ISU_P, each of the third sensing line TL3P and the third pads T3P may be provided in plurality. The plurality of third sensing lines TL3P and the plurality of third pads T3P may be connected to corresponding third electrodes GE, respectively. As described above, the plurality of third sensing lines TL3P and the second sensing lines TL21 and TL22 may be alternately connected to the sides of the third electrodes GE, to which the second sensing lines TL21 and TL22 are not connected. Here, the third electrodes GE may receive electrical signals for sensing the noise in the active area AA to sense whether the noise due to a position occurs. According to an exemplary embodiment, the input sensing unit ISU_P may be designed with various structures, and, as such, exemplary embodiments are not limited to a specific configuration of the input sensing unit ISU_P.

Figure 7A:
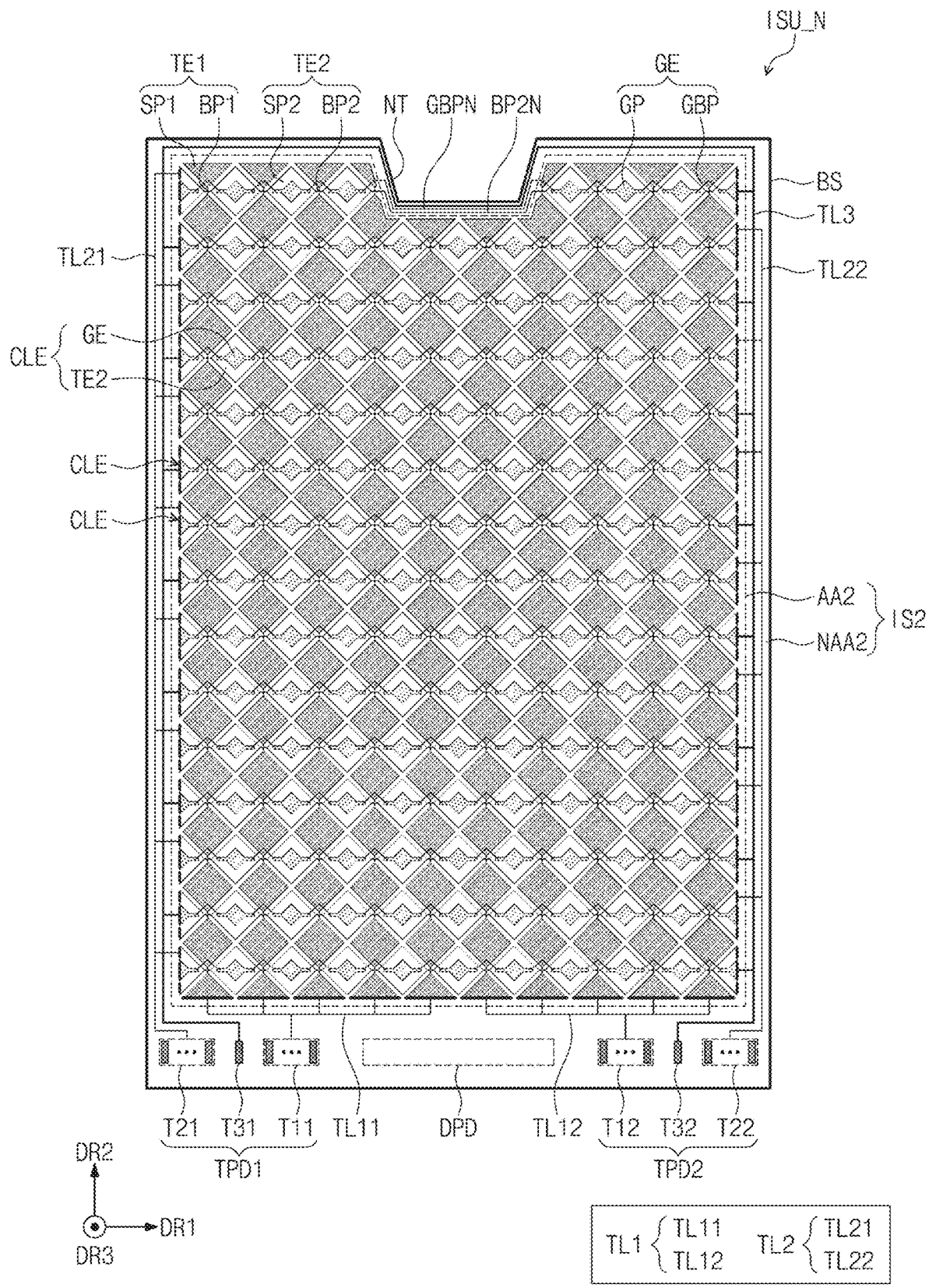
FIGS. 7A and 7B are plan views of input sensing units according to various exemplary embodiments.
Figure 7B:
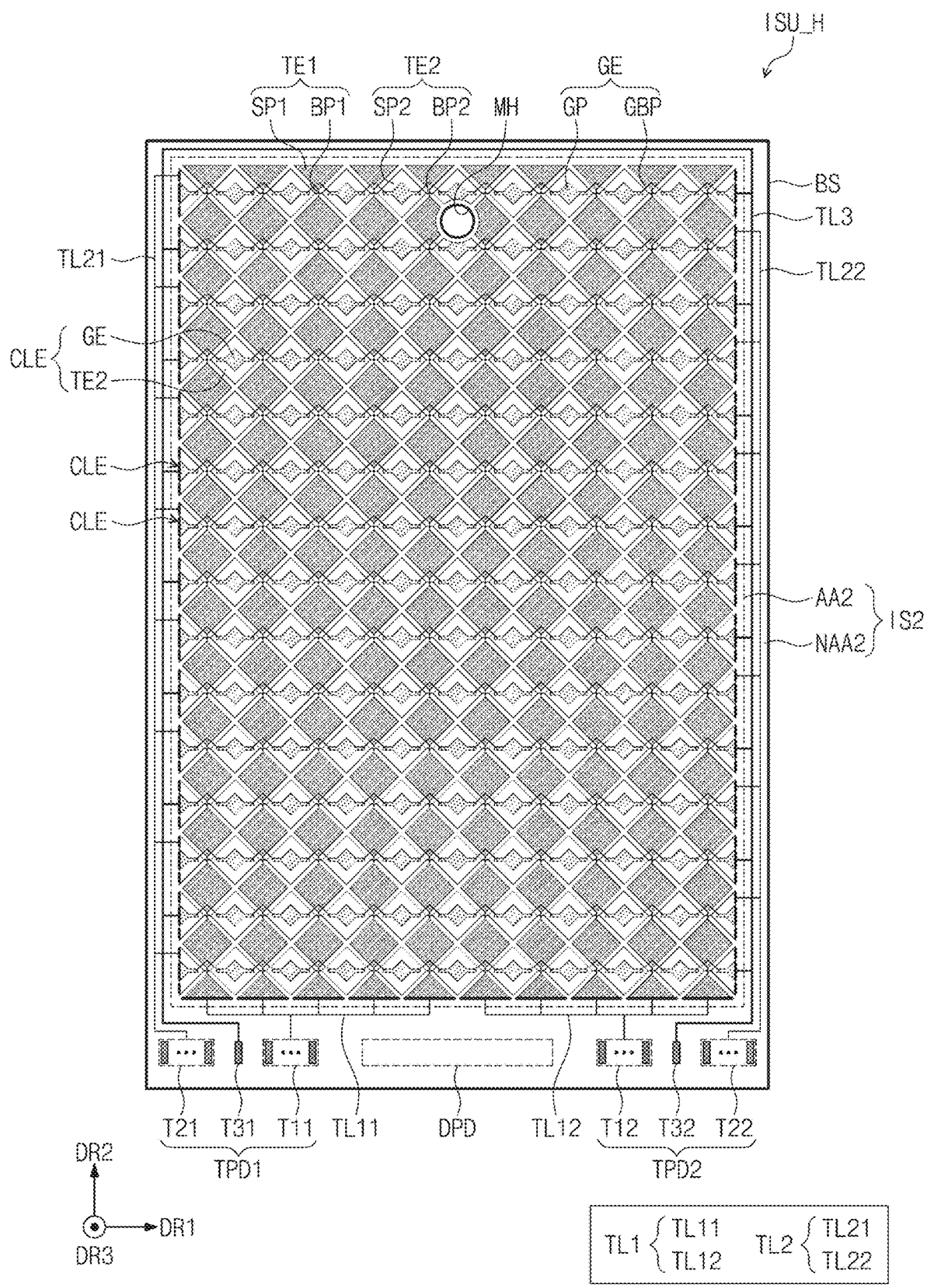

FIGS. 7A and 7B are plan views of input sensing units according to various exemplary embodiments. For instance, FIGS. 7A and 7B illustrate schematic plan views of input sensing units ISU_N and ISU_H according to various exemplary embodiments. As described above, although each of the first and second lower sub lines TL11 and TL12, the first and second sub sensing lines TL21 and TL22 includes the plurality of lines that are divided to be respectively connected to the corresponding pads T11, T12, T21, and T22, for convenience of description, each of the first and second lower sub lines TL11 and TL12, the first and second sub sensing lines TL21 and TL22, and the corresponding pads T11, T12, T21, and T22 is shown as a single grouped line or pad. Hereinafter, the present disclosure will be described with reference to the accompanying drawings.

As illustrated in FIGS. 7A and 7B, the input sensing units ISU_N and ISU_H may have various shapes. For example, Referring to FIG. 7A, an input sensing unit ISU_N may include a predetermined notch part NT. The notch part NT may be defined in the base substrate BS or one side of the display panel unit DPU (see FIG. 6A). In an exemplary embodiment, the notch part NT may be defined by recessing a portion of an upper side of the base substrate BS that extends in the first direction DR1, in an opposite direction of the second direction DR2.

Since the notch part NT is defined, a portion of the first electrode TE1 and a portion of the third electrode GE may be removed from the input sensing unit ISU of FIG. 6B. At least one of the row electrodes CLE may extend via the notch part NT. In an exemplary embodiment, the row electrode CLE disposed at the uppermost side may pass through the notch part NT.

For example, a portion of the first electrode TE1 may have a surface area or length less than that of an area spaced apart from the notch part NT due to the notch part NT. The first electrode TE1, which is spaced apart from the notch part NT in the second direction DR2, may have a length and surface area less than those of the other first electrodes TE1 spaced apart from the notch part NT in the first direction DR1.

Also, for example, a portion of the second electrode TE2 may be divided into left and right portions with respect to the notch part NT. The second connection pattern BP2N, which connects the second sensing pattern SP2 adjacent to the left side of the notch part NT and the second sensing pattern SP2 adjacent to the right side of the notch part NT, of the second electrodes TE2 may extend along an edge of the notch part NT. Thus, a portion of the second electrode TE2 may be electrically connected through the second connection pattern BP2N even though some of the second electrodes TE2 are separated by the notch part NT.

Also, for example, a portion of the third electrodes GE may be divided into left and right portions with respect to the notch part NT, like the second electrodes TE2. Thus, the conductive connection pattern GBPN adjacent to the notch part NT may extend along an edge of the notch part NT to connect the two conductive patterns GP, which are spaced apart from each other with the notch part NT therebetween in the first direction DR1, to each other. Thus, a portion of the third electrode GE may be electrically connected through the conductive connection pattern GBPN even though some of the third electrodes GE are separated by the notch part NT.

As illustrated in FIG. 7B, the input sensing unit ISU_M may include a predetermined hole MH. The hole MH is defined in the first area AA2 to pass through at least the input sensing unit ISU_H. In an exemplary embodiment, the hole MH may pass through the input sensing unit ISU_H and the base substrate BS. At least a portion of the electronic module EM1 (see FIG. 5A), such as the camera module CMM (see FIG. 5A) or the light receiving module LRM, may be disposed to overlap the hole MH.

At least a portion of the first electrode TE1, the second electrode TE2, and the third electrode GE may have a shape of which a portion adjacent to the hole MH is removed. In an exemplary embodiment, the hole MH may be defined between two row electrodes CLE sequentially arranged from the outermost electrode of the row electrodes CLE.

According to an exemplary embodiment, the hole MH is adjacent to two first sensing patterns SP1, two second sensing patterns SP2, and two conductive patterns GP. Each of the two first sensing patterns SP1, the two second sensing patterns SP2, and the two conductive patterns GP that are adjacent to the hole MH may have a relatively small surface area when compared to the corresponding peripheral patterns. Sides, which face the hole MH, of the two first sensing patterns SP1, the two second sensing patterns SP2, and the two conductive patterns GP may have curved shapes extending along an edge of the hole MH.

According to various exemplary embodiments, the input sensing units ISU, ISU_N, and ISU_H having various shapes may be provided. Also, the input sensing units ISU, ISU_N, and ISU_H having the various shapes may have the structure in which the second sensing lines TL21 and TL22 and the third sensing line TL3 are respectively connected at different positions with respect to a single row electrode CLE. Therefore, the electronic apparatus EA, in which overlapping between the third sensing line TL3 and the second sensing lines TL21 and TL22 in a plan view is prevented is provided, and, as such, electrical reliability of the electronic apparatus EA may be improved.

Figure 8A:
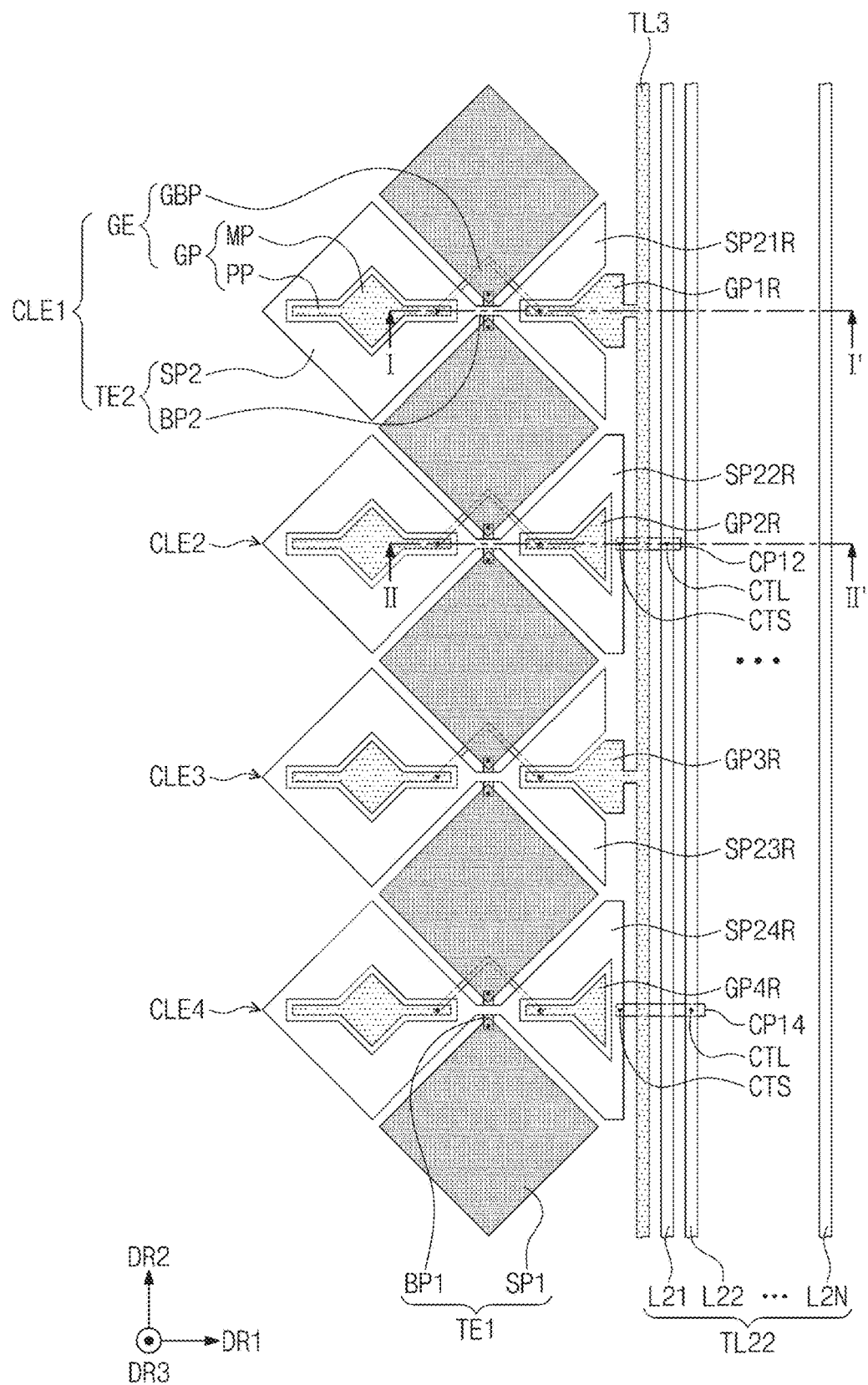
FIGS. 8A and 8B are plan views illustrating a portion of an area of each of the input sensing units of FIGS. 6B, 6C, 7A, and 7B according to various exemplary embodiments.
Figure 8B:
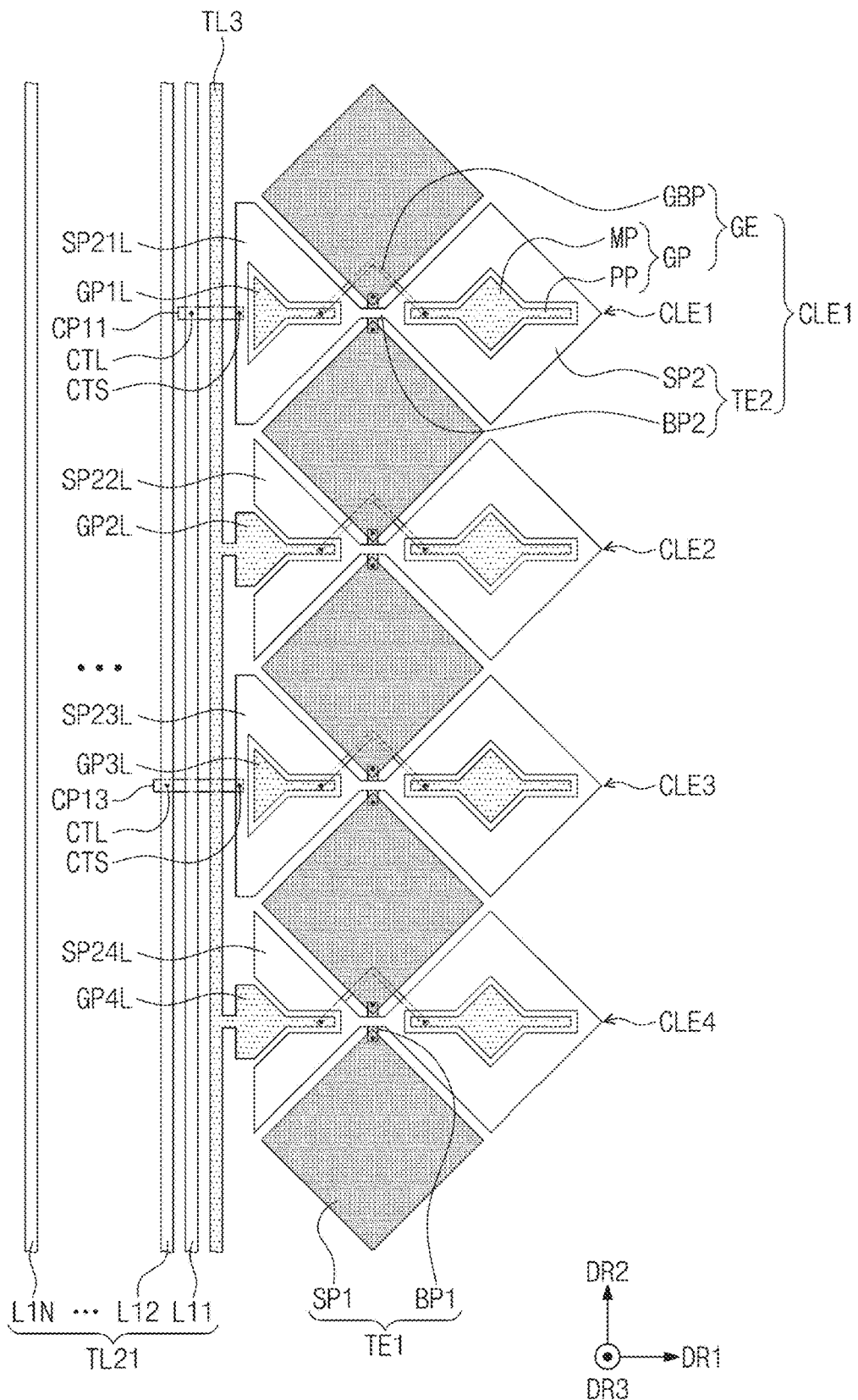

FIGS. 8A and 8B are plan views illustrating a portion of an area of each of the input sensing units of FIGS. 6B, 6C, 7A, and 7B according to various exemplary embodiments. For convenience of description, FIG. 8A illustrates a right area of four row electrodes CLE1, CLE2, CLE3, and CLE4 of the input sensing unit ISU of FIG. 6B, and a left area is illustrated in FIG. 8B. Also, portions L11, L12, and L2N of the plurality of first sub lines TL21 will be described with reference to FIGS. 7A and 7B. The same reference numerals may be given to components that are the same as those of FIGS. 1 to 7B, and their detailed descriptions will be primarily omitted.

As illustrated in FIGS. 8A and 8B, the first to fourth row electrodes CLE1, CLE2, CLE3, and CLE4 of the plurality of row electrodes CLE are sequentially arranged in a direction opposite to the second direction DR2. In an exemplary embodiment, the first and third row electrodes CLE1 and CLE3 are provided in odd-numbered row electrode positions of the input sensing unit ISU of FIG. 6B, and the second and fourth row electrodes CLE2 and CLE4 may be provided in even-numbered row electrode positions of the input sensing unit ISU of FIG. 6B.

The first row electrode CLE1 may be connected to one of the second sensing lines TL21 and TL22 at one side and connected to the third sensing line TL3 at the other side. For example, referring to FIG. 8A, a right end GP1R of the third electrode GE of the first row electrode CLE1 is connected to the third sensing line TL3. On the other hand, a right end SP21R of the second electrode TE2 of the first row electrode CLE1 may not be connected to the second sub line TL22. The right end SP21R of the second electrode TE2 of the first row electrode CLE1 is spaced apart from the second and third sensing lines TL22 and TL3. Thus, the third sensing line TL3 may be stably connected to the third electrode GE without overlapping the second sub line TL22 or the second electrode TE2.

Referring to FIG. 8B, a left end SP21L of the second electrode TE2 of the first row electrode CLE1 is connected to one of the first sub lines TL21. Here, the electronic apparatus EA may further include a connection part CP11 connecting the second electrode TE2 of the first row electrode CLE1 to one line L11 of the first sub lines TL21. The left end SP21L of the second electrode TE2 of the first row electrode CLE1 and the line L11 may be connected to the connection part CP11, and then electrically connected to each other through a contact part CTS between the connection part CP11 and the second electrode TE2 of the first row electrode CLE1 and a contact part CTL between the connection part CP11 and one line L11 of the first sub lines TL21. Thus, the second electrode TE2 of the first row electrode CLE1 may be stably connected to the one line L11 of the first sub lines TL21 without contacting the third sensing line TL3.

On the other hand, a left end GP1L of the third electrode GE of the first row electrode CLE1 may not be connected to the third sensing line TL3. The left end GP1L of the third electrode GE of the first row electrode CLE1 is spaced apart from the first and third sensing lines TL21 and TL3.

According to an exemplary embodiment, in the first row electrode CLE1, the connection between the third sensing line TL3 and the third electrode GE and the connection between the second sensing line L11 and the second electrode TE2, which correspond to each other, may be performed on layers different from each other. Thus, the overlapping between the third sensing line TL3 and the second electrode TE2 may be reduced. In an exemplary embodiment, an interference between the third sensing line TL3 and the second sensing line L11 may be prevented to improve the electrical reliability of the electronic apparatus EA.

Similarly, referring to FIGS. 8A and 8B, in each of the second to fourth row electrodes CLE2, CLE3, and CLE4, the connection with the third sensing line TL3 and the connection with the second sensing lines TL21 and TL22 may be performed at positions different from each other. One side of each of the second to fourth row electrodes CLE2, CLE3, and CLE4 may be selectively connected to one of the second sensing lines TL21 and TL22 and the third sensing line TL3.

For example, the left end GP2L of the second row electrode CLE2 may be connected to the third sensing line TL3, and the right end SP22R of the second row electrode CLE2 may be connected to one line L21 of the second sensing lines TL21 and TL22. A left end GP2L of the third electrode GE of the second row electrode CLE2 may be connected to the third sensing line TL3, a left end SP22L of the second electrode TE2 of the second row electrode CLE2 may not be connected to the second sensing lines TL21 and TL22. On the other hand, a right end SP22R of the second electrode TE2 of the second row electrode CLE2 may be connected to one line L21 of the second sensing lines TL21 and TL22, and a right end GP2R of the third electrode GE of the second row electrode CLE2 may not be connected to the third sensing line TL3 and may be spaced apart from the third sensing line TL3.

In an exemplary embodiment, the third row electrode CLE3 may have a connection structure corresponding to that of the first row electrode CLE1. For instance, a left end SP23L of the third row electrode CLE3 may be connected to one line L12 of the second sensing lines TL21 and TL22, and a right end GP3R of the third row electrode CLE3 may be connected to the third sensing line TL3. That is, the left end SP23L of the second electrode TE2 of the third row electrode CLE3 may be connected to one line L12 of the second sensing lines TL21 and TL22, and the right end GP3R of the third electrode GE of the third row electrode CLE3 may be connected to the third sensing line TL3. A right end SP23R of the second electrode TE2 of the third row electrode CLE3 and a left end GP3L of the third electrode GE of the third row electrode CLE3 may not be connected to the second and third sensing lines TL21, TL22, and TL3.

The fourth row electrode CLE4 may have a connection structure corresponding to that of the second row electrode CLE2. For instance, a left end GP4L of the fourth row electrode CLE4 may be connected to the third sensing line TL3, and a right end SP24R of the fourth row electrode CLE4 may be connected to one line L22 of the second sensing lines TL21 and TL22. That is, the left end GP4L of the third electrode GE of the fourth row electrode CLE4 may be connected to the third sensing line TL3, and a left end SP24L of the second electrode TE2 of the fourth row electrode CLE4 may not be connected to the second sensing lines TL21 and TL22. On the other hand, the right end SP24R of the second electrode TE2 of the fourth row electrode CLE4 may be connected to one line L22 of the second sensing lines TL21 and TL22, and a right end GP4R of the third electrode GE of the fourth row electrode CLE4 may not be connected to the third sensing line TL3.

According to various exemplary embodiments, the second electrode TE2 and the third electrode GE3, which constitute the same row electrode CLE, may be respectively connected to the corresponding lines of the second and third sensing lines TL21, TL22, and TL3 at different positions. Thus, the connection between the second electrode TE2 and the second sensing lines TL21 and TL22, and the connection between the third electrode GE and the third sensing line TL3 may be designed to non-overlap each other in a plan view.

Further, according to various exemplary embodiments, an overlap between the third sensing line TL3 and the other sensing lines TL11, TL12, TL21, and TL22, or an overlap between the third electrode GE and other sensing lines TL11, TL12, TL21, and TL22 may be reduced or prevented. As such, an occurrence of failure, such as noise generated between the different signal lines in the input sensing unit (e.g., the input sensing unit ISU of FIG. 6B) may be prevented, and, in this manner, the electrical reliability of the electronic apparatus EA may be improved.

Figure 9A:
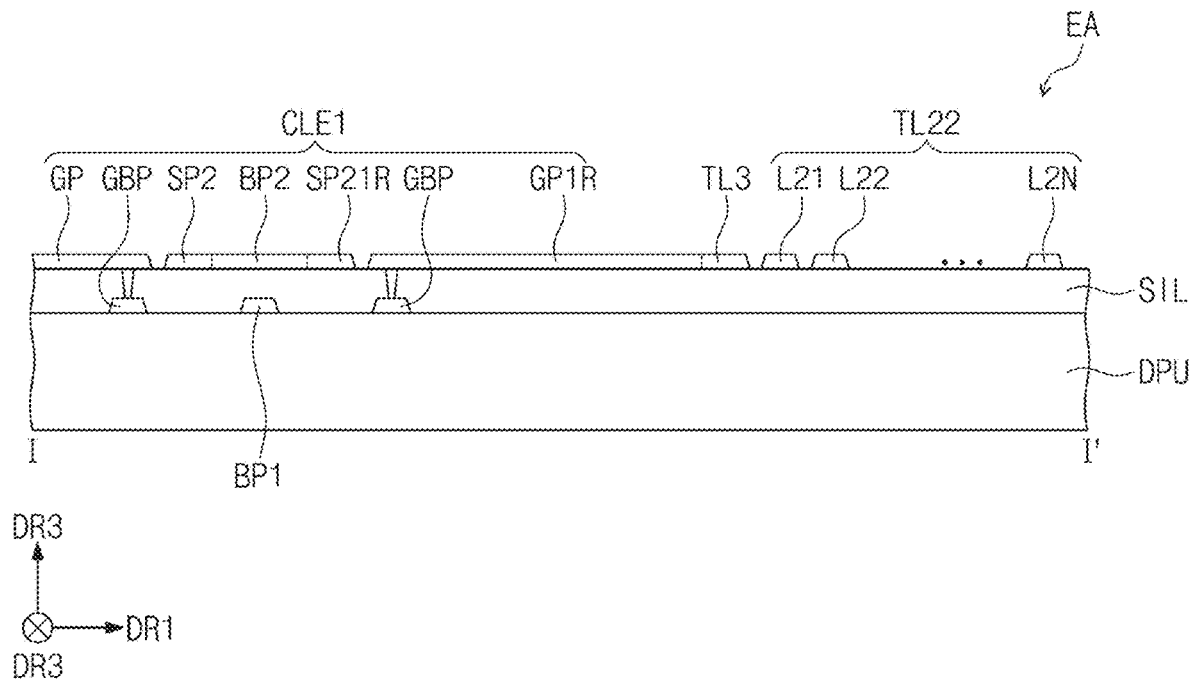
FIG. 9A is a cross-sectional view taken along sectional line I-I' FIG. 8A according to an exemplary embodiment.

FIG. 9A is a cross-sectional view taken along sectional line I-I' FIG. 8A according to an exemplary embodiment.

Figure 9B:
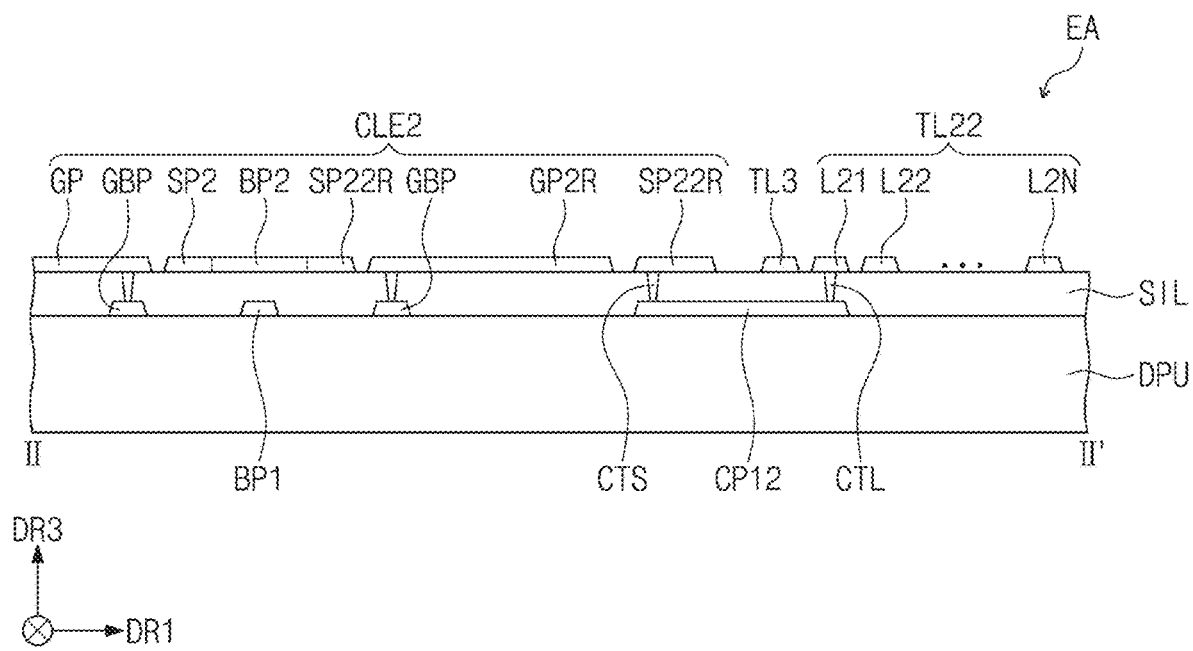
FIG. 9B is a cross-sectional view taken along sectional line II-II' FIG. 8A according to an exemplary embodiment.

FIG. 9B is a cross-sectional view taken along sectional line II-II' FIG. 8A according to an exemplary embodiment.

Referring to FIGS. 9A and 9B, the first row electrode CLE1, the second row electrode CLE2, the third sensing line TL3, and the second sub lines TL22 (also referred to as second sensing lines TL22) are disposed on the display panel unit DPU. For convenience of description, the pixel PX (see FIG. 6A) and the signal lines PL, DL, and GL (see FIG. 6A) constituting the display panel unit DPU will be omitted from the illustrations.

According to an exemplary embodiment, conductive patterns GP and GP1R, second sensing patterns SP2 and SP21R, and second connection patterns BP2 may be disposed on a layer different from that of the conductive connection pattern GBP and the first connection pattern BP1. The conductive patterns GP and GP1R may be connected to the conductive connection pattern GBP by passing through the insulation layer SIL to constitute the third electrode GE (see, e.g., FIG. 7A) extending in the first direction DR1.

The second sensing patterns SP2 and SP21R may be directly connected to the second connection patterns BP2 to constitute the second electrode TE2 (see, e.g., FIG. 7A) extending in the first direction DR1. In an exemplary embodiment, the second sensing patterns SP2 and SP21R may be connected to the second connection pattern BP2 to provide a single body.

The first sensing pattern SP1 (see, e.g., FIG. 7A) (not shown in FIGS. 9A and 9B) may be connected to the first connection pattern BP1 by passing through the insulation layer SIL to constitute the first electrode TE1 crossing the second electrode TE2. According to an exemplary embodiment, the second and third sensing lines TL22 and TL3 may be disposed on the same layer as the second electrode TE2 and the third electrode GE.

Referring to FIG. 9A, a right end GP1R of the third electrode GE of the first row electrode CLE1 is connected to the third sensing line TL3. The third sensing line TL3 may be directly connected to a right end GR1R of the third electrode GE of the first row electrode CLE1, and, thus, may not overlap a right end SP2R of the second electrode TE2 of the first row electrode CLE1 in a plan view.

Referring to FIG. 9B, a right end SP22R of the second electrode TE2 of the second row electrode CLE2 is connected to the corresponding line L21 of the second sensing lines TL22. Here, the line L21 corresponding to the second row electrode CLE2 may be electrically connected through the connection part CP12 disposed on a different layer than the second electrode TE2. In an exemplary embodiment, the connection part CP12 may be disposed on the same layer as the second connection pattern BP2 or the conductive connection pattern GBP. The line L21 corresponding to the right end SP22R of the second electrode TE2 of the second row electrode CLE2 may be connected to the connection part CP12 through the insulation layer SIL, and, thus, may be stably connected to the line L21, but not electrically connected to the third sensing line TL3. However, this is merely an example. For example, the connection part CP12 may be disposed above the third sensing line TL3, but exemplary embodiments are not limited thereto.

Although not shown, the right end GP1R of the third electrode TE3 of the first row electrode CLE1 may be connected to the third sensing line TL3 through a connection part, and the right end SP22R of the second electrode TE2 of the second row electrode CLE2 may be directly connected to the corresponding line L22 according to the arranged positions of the second sensing lines TL21 and TL22 and the third sensing line TL3. Alternatively, the right end GP1R of the third electrode TE3 of the first row electrode CLE1 and the right end SP22R of the second electrode TE2 of the second row electrode CLE2 may be respectively connected to the corresponding third and second sensing lines TL3 and L22 through connection parts. The electronic apparatus EA according to an exemplary embodiment may be designed in various shapes as long as the third electrode GE and the second electrode TE2 are connected at different positions for each row electrode CLE, but exemplary embodiments are not limited thereto.

Figure 10A:
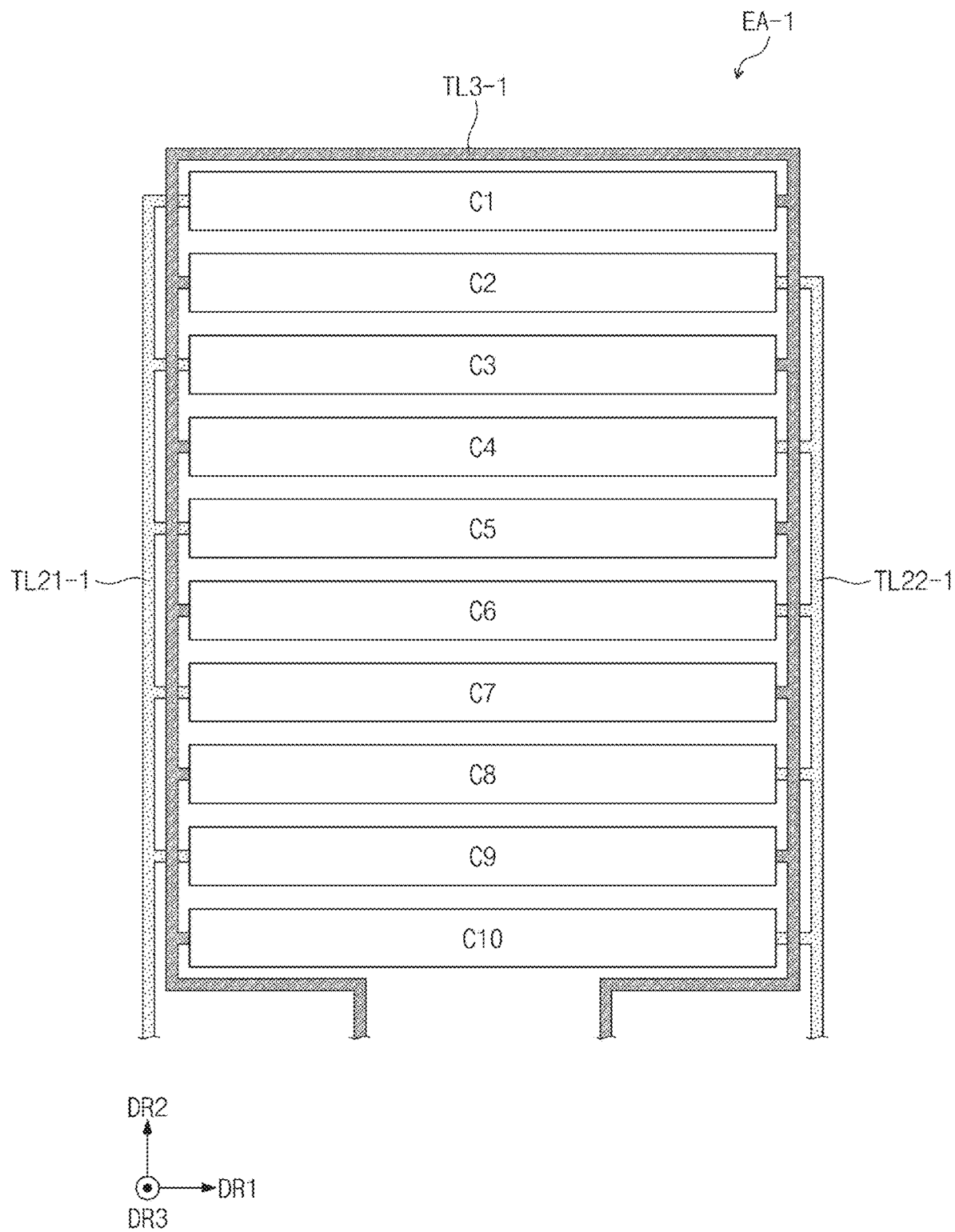
FIGS. 10A, 10B, and 10C are schematic plan views of electronic apparatuses according to various exemplary embodiments.
Figure 10B:
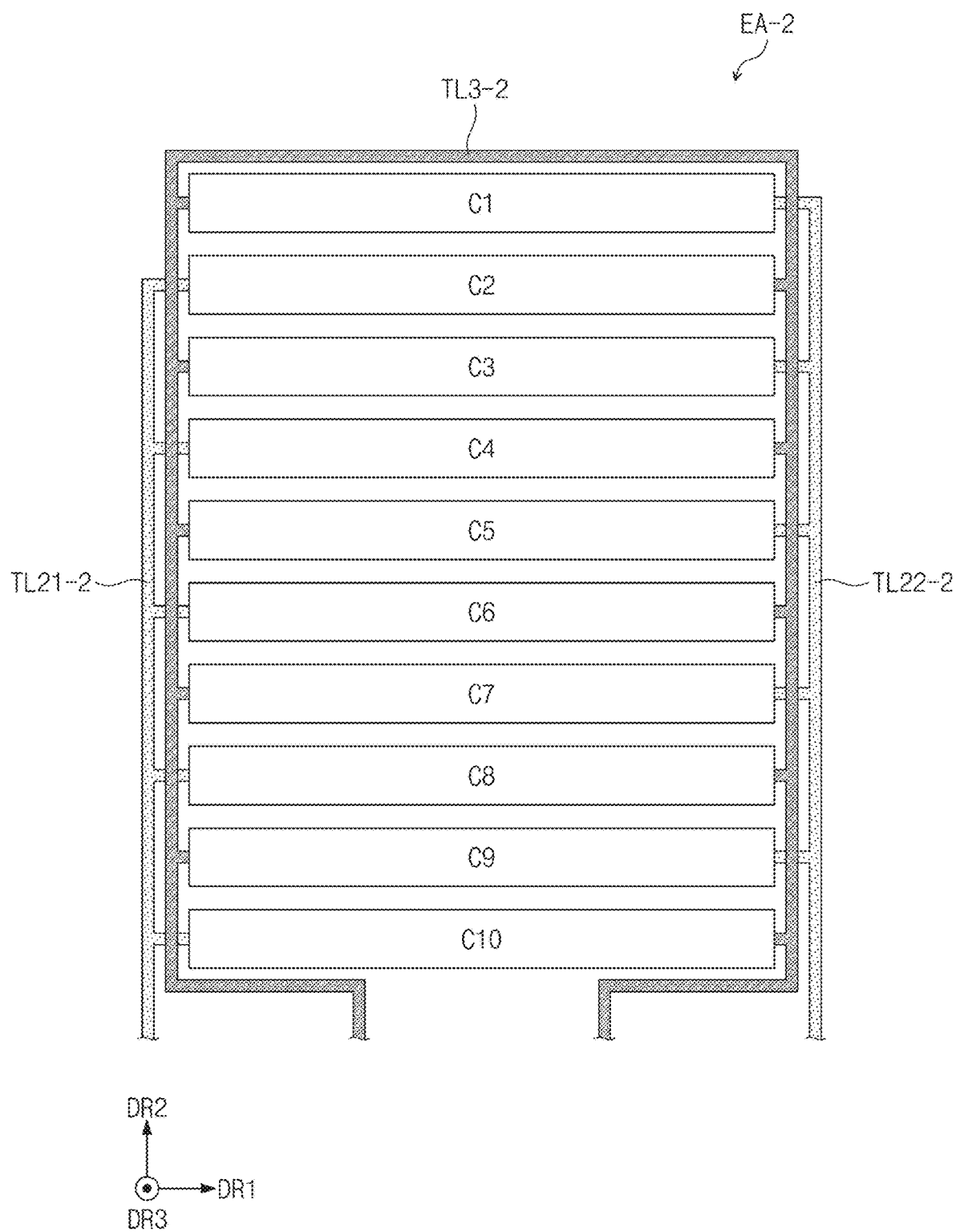
Figure 10C:
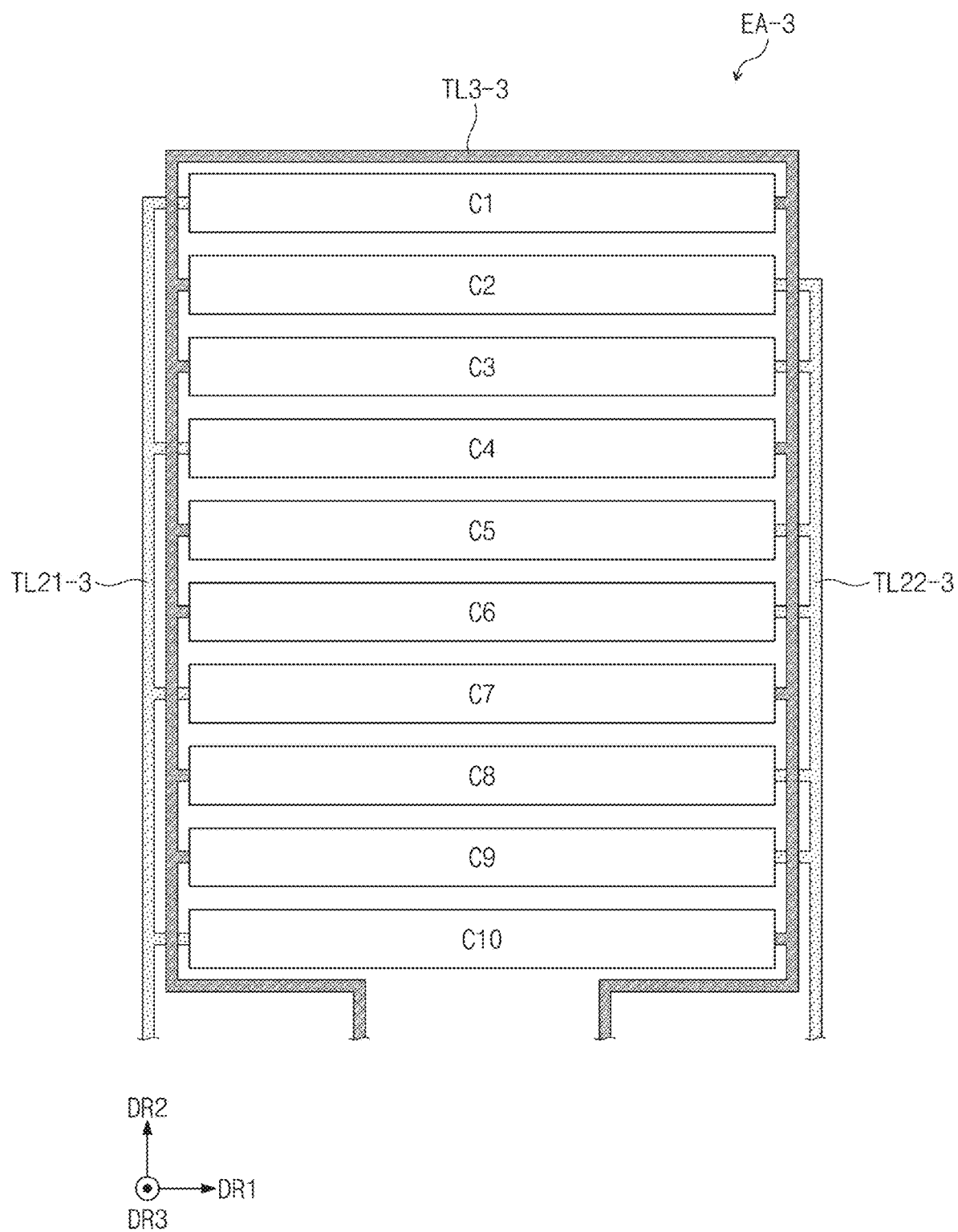

FIGS. 10A, 10B, and 10C are schematic plan views of electronic apparatuses according to various exemplary embodiments. For convenience of description, in FIGS. 10A to 10C, a plurality of row electrodes C1 to C10 sequentially arranged in a direction opposite to the second direction DR2 have a rectangular shape.

As illustrated in FIG. 10A, in an electronic apparatus EA-1, each of row electrodes C1 to C10 are connected to second sensing lines TL21-1 and TL22-1 through one end of both ends including a right end and a left end, and are connected to a third sensing line TL3-1 through a remaining end of both of the ends.

For instance, the odd-numbered row electrodes C1, C3, C5, C7, and C9 of the row electrodes C1 to C10 may be connected to the second sensing lines TL21-1 through the left end, and the even-numbered row electrodes C2, C4, C6, C8, and C10 of the row electrodes C1 to C10 may be connected to the second sensing lines TL22-1 through the right end.

The odd-numbered row electrodes C1, C3, C5, C7, and C9 of the row electrodes C1 to C10 may be connected to the third sensing lines TL3-1 through the right ends, and the even-numbered row electrodes C2, C4, C6, C8, and C10 of the row electrodes C1 to C10 may be connected to the third sensing lines TL3-1 through the left ends. In an exemplary embodiment, the row electrodes C1 to C10 may be connected to the third sensing line TL3-1 through the side ends, which are not connected to the second sensing lines TL21-1 and TL22-1.

Alternatively, as illustrated in FIG. 10B, the odd-numbered row electrodes C1, C3, C5, C7, and C9 of the row electrodes C1 to C10 may be connected to the second sensing lines TL22-2 through the right ends, and the even-numbered row electrodes C2, C4, C6, C8, and C10 of the row electrodes C1 to C10 may be connected to the second sensing lines TL21-2 through the left ends.

The odd-numbered row electrodes C1, C3, C5, C7, and C9 of the row electrodes C1 to C10 may be connected to the third sensing lines TL3-2 through the left ends, and the even-numbered row electrodes C2, C4, C6, C8, and C10 of the row electrodes C1 to C10 may be connected to the third sensing lines TL3-2 through the right ends. In an exemplary embodiment, the row electrodes C1 to C10 may be connected to the third sensing line TL3-2 through the side ends, which are not connected to the second sensing lines TL21-2 and TL22-2.

Alternatively, as illustrated in FIG. 10C, in an electronic apparatus EA-3, row electrodes C1, C4, C7, and C10 of row electrodes C1 to C10 may be connected to second sensing lines TL21-3 through left ends, and row electrodes C2, C3, C5, C6, C8, and C9 of the row electrodes C1 to C10 may be connected to second sensing lines TL22-3 through right ends. Thus, the row electrodes C1, C4, C7, and C10 of the row electrodes C1 to C10 may be connected to a third sensing lines TL3-3 through the right ends, and the row electrodes C2, C3, C5, C6, C8, and C9 of the row electrodes C1 to C10 may be connected to the third sensing lines TL3-3 through the left ends.

According to various exemplary embodiments, one row electrode may be connected to a second sensing line through one end of both of the ends, and may be connected to the third sensing line through the other end of both of the ends. The connection between one row electrode and the second sensing line and the connection between one row electrode and the third sensing line may be performed at positions different from each other and also may not overlap each other in a plan view. Thus, an electrical interference between the second sensing line and the third sensing line, to which different signals are applied, may be prevented, and, thus, may improve the electrical reliability of the electronic apparatus.

Figure 11:
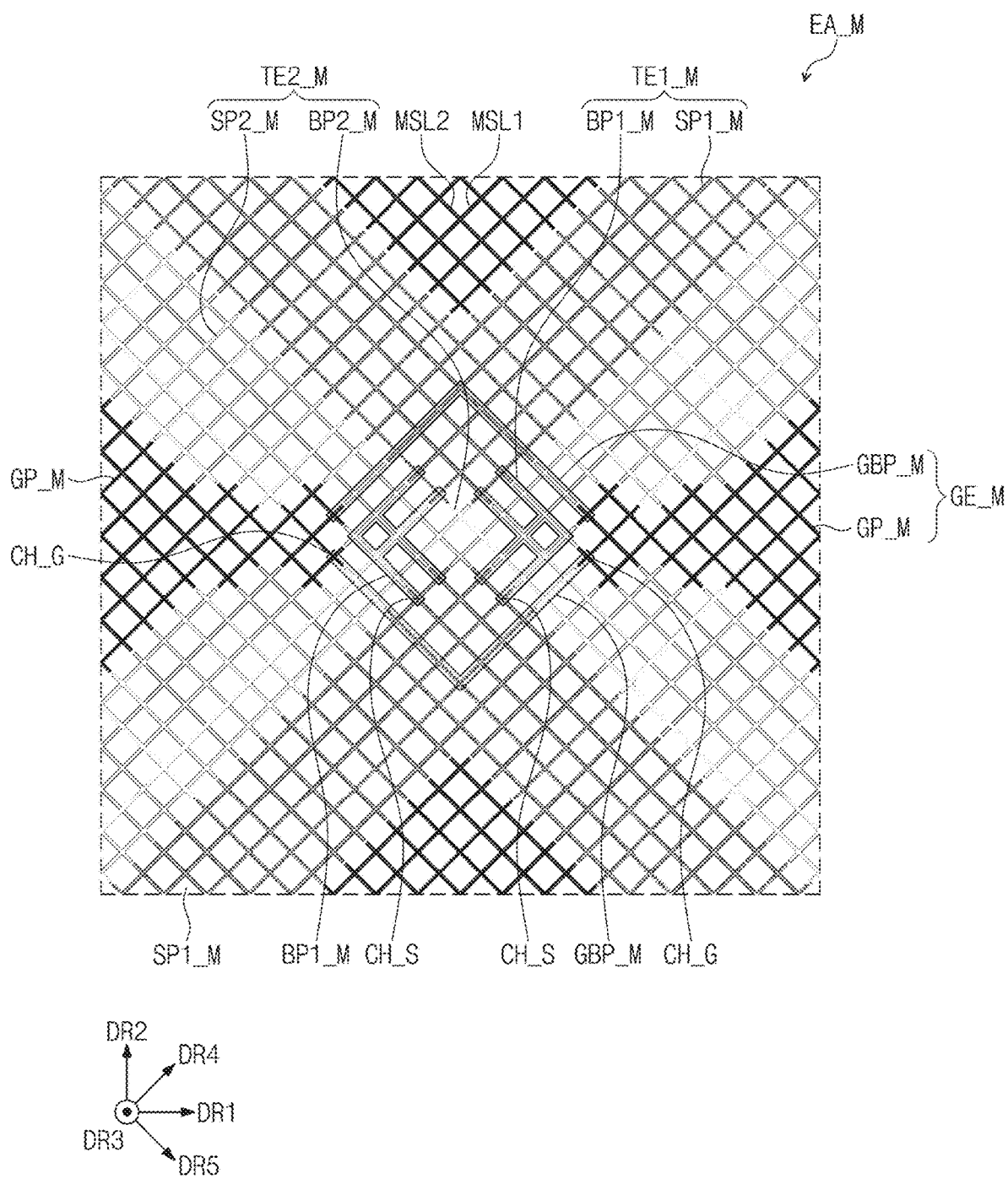
FIG. 11 is a plan view of an electronic apparatus according to an exemplary embodiment.
Figure 12A:
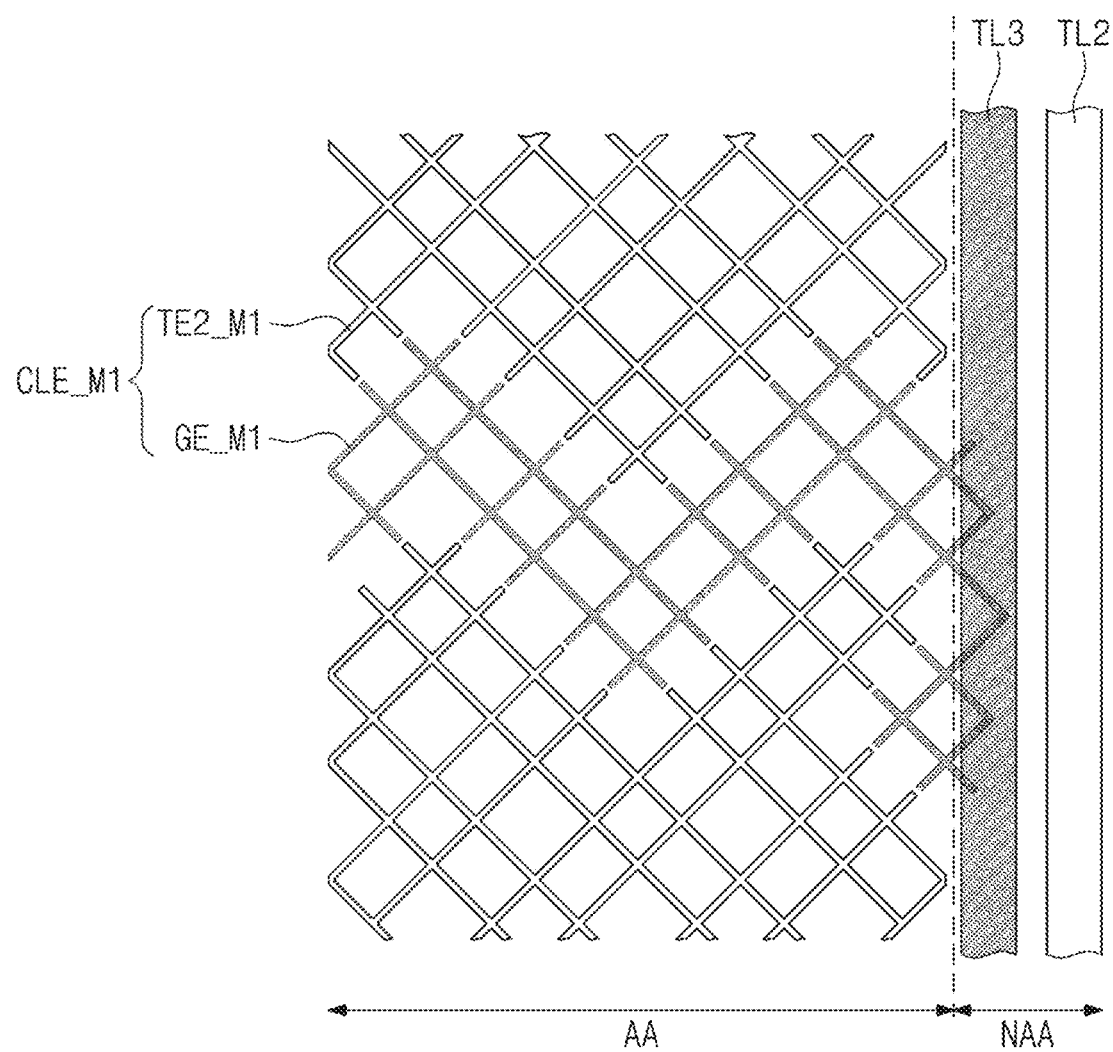
FIGS. 12A and 12B are plan views illustrating a portion of an electronic apparatus according to various exemplary embodiments.
Figure 12B:
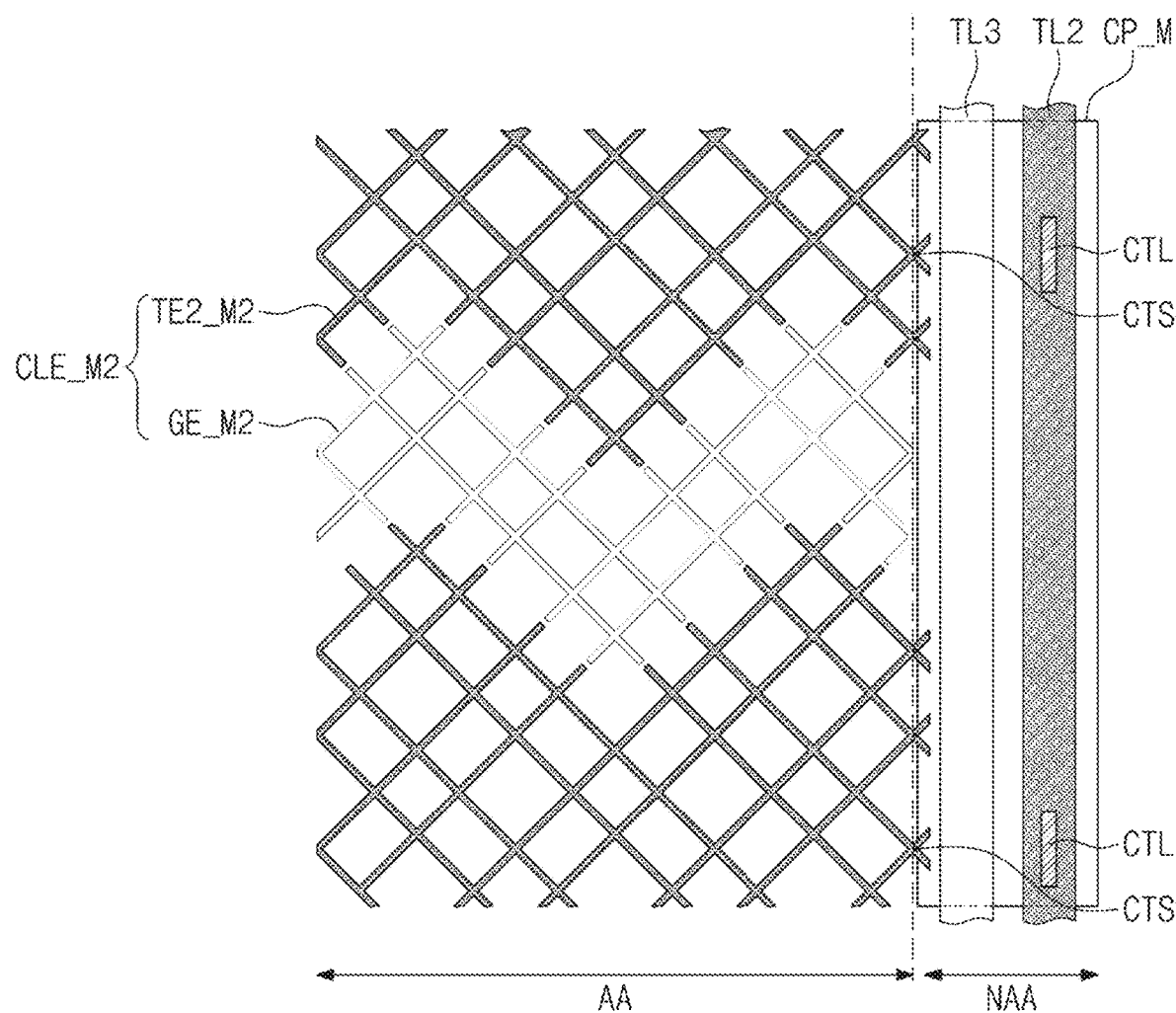

FIG. 11 is a plan view of an electronic apparatus according to an exemplary embodiment. FIGS. 12A and 12B are plan views illustrating a portion of an electronic apparatus according to various exemplary embodiments. FIG. 11 illustrates a portion of an active area AA of the electronic apparatus EA_M, and FIGS. 12A and 12B illustrate a boundary area between the active area AA and a peripheral area NAA of the electronic apparatus EA_M. The same reference numerals may be given to components that are the same as those of FIGS. 1 to 10C, and their detailed descriptions will be primarily omitted.

As illustrated in FIG. 11, each of a first electrode TE1_M, a second electrode TE2-M, and a third electrode GE_M may include a plurality of mesh lines. The mesh lines may include a first mesh line MSL1 extending in a first diagonal direction DR4 crossing the first direction DR1 and the second direction DR2 and a second mesh line MSL2 extending in a second diagonal direction DR5 crossing the first diagonal direction DR4.

The first and second mesh lines MSL1 and MSL2 may be disposed on the same plane (or layer) and may be connected to each other. The first and second mesh lines MSL1 and MSL2 form a first sensing pattern SP1_M, a second sensing pattern SP2_M, a second connection pattern BP2_M, and a conductive pattern GP_M. Boundaries between the first sensing pattern SP1_M, the second sensing pattern SP2_M, the second connection pattern BP2_M, and the conductive pattern GP_M may be formed by cutting the first and second mesh lines MSL1 and MSL2.

In an exemplary embodiment, each of the conductive connection pattern GBP_M and the first connection patterns BP1_M may be disposed on a layer different from that of each of the first and second mesh lines MSL1 and MSL2. The conductive connection pattern GBP_M and the first connection pattern BP1_M may be disposed on the same layer and spaced apart from each other in a plan view.

The conductive connection pattern GBP_M may be connected to the first and second mesh lines MSL1 and MSL2 defining the conductive pattern GP_M through predetermined contact parts CH_G, and the first connection pattern BP1_M may be connected to the first and second mesh lines MSL1 and MSL2 defining the first sensing pattern SP1_M through predetermined contact parts CH_S.

According to various exemplary embodiments, the second electrode TE2_M and the third electrode GE_M may extend in the first direction DR1. Also, when the second electrode TE2_M and the third electrode GE_M are disposed in the same row, the second electrode TE2_M and the third electrode GE_M may be spaced apart from each other in a plan view. Thus, electrical connection between the second electrode TE2_M and the third electrode GE_M, which independently transmit signals, may be prevented, and, as such, electrical reliability of the electronic apparatus EA_M may be improved.

FIG. 12A illustrates a portion of an area of a right end of a first row electrode CLE_M1. As illustrated in FIG. 12A, in the first row electrode CLE_M1, a right end of a third electrode GE_M1 may further extend in the first direction DR1 than a right end of the second electrode TE2_M1. The right end of the third electrode GE_M1 may be connected to a third sensing line TL3.

In an exemplary embodiment, the first row electrode CLE_M1 and the third sensing line TL3 may be disposed on the same line or layer. Thus, the right end of the third electrode GE_M1 may be directly connected to the third sensing line TL3. However, this is merely an example. For instance, the right end of the third electrode GE_M1 may be integrated with the third sensing line TL3, but exemplary embodiments are not limited thereto.

FIG. 12B illustrates a portion of an area of a right end of a second row electrode CLE_M2. As illustrated in FIG. 12B, in the second row electrode CLE_M2, a right end of a second electrode TE2_M2 may further extend in the first direction DR1 than a right end of the third electrode GE_M2.

The right end of the second electrode TE2_M2 is connected to a second sensing line TL2 through a connection part CP_M. In an exemplary embodiment, the connection part CP_M is disposed on a layer different from that of each of the second and third sensing lines TL2 and TL3. The second electrode TE2_M2 may be connected to the connection part CP_M through predetermined contact parts CTS. The second sensing line TL2 may be connected to the connection part CP_M through predetermined contact parts CTL. Thus, the second electrode TE2_M may be stably connected to the second sensing line TL2 without overlapping the third sensing line TL3.

According to various exemplary embodiments, overlap between the signal lines that transmit the electrical signals different from each other may be reduced or prevented. Thus, the occurrence of noise due to the electrical interference between the signal lines may be reduced (or prevented) to improve the input sensing unit having the improved external input sensitivity. In addition, the display apparatus having the improved electrical reliability may be provided.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A electronic apparatus comprising
a display panel comprising an active area comprising light-emitting areas and a peripheral area adjacent to the active area, and light-emitting elements configured to provide light to light-emitting areas and a thin film encapsulation layer covering the light-emitting elements;
an input sensing unit on the display panel;
wherein the input sensing unit comprises:
a first conductive layer including connection patterns arranged on the thin film encapsulation layer;
an insulating layer directly on the thin film encapsulation layer and covering the first conductive layer; and a second conductive layer including first sensing patterns connected to the connection patterns through contact holes defined in the insulating layer, second electrodes including second sensing patterns spaced from the first sensing patterns and each having an opening defined therein, and third electrodes including conductive patterns, each of the conductive patterns being in the opening and spaced from the second sensing patterns, and a sensing line connected to the third electrodes, wherein the sensing line includes a first portion adjacent at least a portion of the peripheral area, a second portion protruding from the first portion and connected to a first side of one of the third electrodes, and a third portion protruding from the first portion and connected to a second side opposite the first side of another one of the third electrodes.

2. The electronic apparatus of claim 1, wherein each of the first sensing patterns and the second sensing patterns comprises mesh lines that intersect with each other and define mesh openings overlapping with the light-emitting areas.

3. The electronic apparatus of claim 1, wherein the second electrodes and the third electrodes are configured to receive different voltages.

4. The electronic apparatus of claim 3, wherein the third electrodes are configured to receive a ground voltage.

5. The electronic apparatus of claim 1, wherein the second portion and the third portion are non-overlapping when viewed in an extension direction of the third electrodes.

6. The electronic apparatus of claim 1, wherein the first conductive layer further comprises conductive connection patterns spaced from the connection patterns, and adjacent ones of the conductive patterns are connected to the conductive connection patterns through contact holes defined in the insulating layer.

7. The electronic apparatus of claim 6, wherein a portion of the conductive connection patterns overlaps with the first sensing patterns, and another portion of the conductive connection patterns overlaps with the second sensing patterns.

8. The electronic apparatus of claim 1, wherein each of the conductive patterns comprises a first pattern having a diamond shape and second patterns protruding from corners of the first pattern.

9. The electronic apparatus of claim 1, wherein the input sensing unit comprises a first pad and a second pad located in the peripheral area, wherein one end of the first portion is connected to the first pad, and another end of the first portion is connected to the second pad.

10. The electronic apparatus of claim 1, wherein the input sensing unit further comprises first sensing lines connected to the first sensing patterns and second sensing lines connected to the second sensing patterns.

11. The electronic apparatus of claim 10, wherein each of the second sensing lines comprises a first line located farther from the active area than the sensing line and second lines protruding from the first line and crossing the sensing line.

12. The electronic apparatus of claim 11, wherein the first line is included in the second conductive layer and the second lines are included in the first conductive layer, and wherein one end of each of the second lines is connected to the corresponding one of the second sensing patterns through a first contact hole defined in the insulating layer, and another end of each of the second lines is connected to the first line through a second contact hole defined in the insulating layer.

13. The electronic apparatus of claim 1, wherein the display panel and the input sensing unit further comprise a notch portion partially recessed inwardly of the active area.

14. The electronic apparatus of claim 1, wherein a hole penetrates through the display panel and the input sensing unit, and overlaps with the active area.

15. The electronic apparatus of claim 1, wherein the second portion comprises a plurality of second portions and the third portion comprises a plurality of third portions, and the second portions and the third portions are alternately arranged along a direction perpendicular to an extension direction of the third electrodes.

* * * * *